US011245382B2

(12) United States Patent
Gibb et al.

(10) Patent No.: US 11,245,382 B2
(45) Date of Patent: *Feb. 8, 2022

(54) METHOD AND STRUCTURE FOR SINGLE CRYSTAL ACOUSTIC RESONATOR DEVICES USING THERMAL RECRYSTALLIZATION

(71) Applicant: Akoustis, Inc., Huntersville, NC (US)

(72) Inventors: Shawn R. Gibb, Huntersville, NC (US); Craig Moe, Penfield, NY (US); Jeff Leathersich, Rochester, NY (US); Steven Denbaars, Goleta, CA (US); Jeffrey B. Shealy, Cornelius, NC (US)

(73) Assignee: AKOUSTIS, INC., Huntersville, NC (US)

( * ) Notice: Subject to any disclaimer, the term of this patent is extended or adjusted under 35 U.S.C. 154(b) by 230 days.

This patent is subject to a terminal disclaimer.

(21) Appl. No.: 16/709,813

(22) Filed: Dec. 10, 2019

(65) Prior Publication Data

US 2020/0119715 A1 Apr. 16, 2020

Related U.S. Application Data

(63) Continuation of application No. 16/035,577, filed on Jul. 13, 2018, now Pat. No. 10,523,180, which is a (Continued)

(51) Int. Cl.
*H03H 9/56* (2006.01)
*H01L 41/253* (2013.01)
(Continued)

(52) U.S. Cl.
CPC .......... *H03H 9/562* (2013.01); *H01L 41/253* (2013.01); *H01L 41/316* (2013.01); *H03H 3/02* (2013.01);
(Continued)

(58) Field of Classification Search
CPC .............. H03H 3/02; H03H 2003/023; H03H 9/02007; H03H 9/02015; H03H 9/02023;
(Continued)

(56) References Cited

U.S. PATENT DOCUMENTS 5,231,327 A 7/1993 Ketcham
5,894,647 A 4/1999 Lakin
(Continued)

FOREIGN PATENT DOCUMENTS

CN 1929302 3/2007
JP H09321361 12/1997
(Continued)

OTHER PUBLICATIONS

International Search Report for PCT/US2015/034560, dated Sep. 18, 2015.
(Continued)

*Primary Examiner* — Peter Dungba Vo
*Assistant Examiner* — Joshua D Anderson
(74) *Attorney, Agent, or Firm* — Richard T. Ogawa; Ogawa P.C.

(57) ABSTRACT

A method of manufacture and structure for an acoustic resonator device having a hybrid piezoelectric stack with a strained single crystal layer and a thermally-treated polycrystalline layer. The method can include forming a strained single crystal piezoelectric layer overlying the nucleation layer and having a strain condition and piezoelectric layer parameters, wherein the strain condition is modulated by nucleation growth parameters and piezoelectric layer parameters to improve one or more piezoelectric properties of the strained single crystal piezoelectric layer. Further, the method can include forming a polycrystalline piezoelectric layer overlying the strained single crystal piezoelectric layer, and performing a thermal treatment on
(Continued)

the polycrystalline piezoelectric layer to form a recrystallized polycrystalline piezoelectric layer. The resulting device with this hybrid piezoelectric stack exhibits improved electromechanical coupling and wide bandwidth performance.

20 Claims, 23 Drawing Sheets

Related U.S. Application Data continuation-in-part of application No. 15/221,358, filed on Jul. 27, 2016, now Pat. No. 10,581,398, which is a continuation-in-part of application No. 15/068,510, filed on Mar. 11, 2016, now Pat. No. 10,217,930.

(51) Int. Cl.
| | | |
|---|---|---|
| *H01L 41/316* | (2013.01) | |
| *H03H 3/02* | (2006.01) | |
| *H03H 9/02* | (2006.01) | |
| *H03H 9/05* | (2006.01) | |
| *H03H 9/10* | (2006.01) | |
| *H03H 9/17* | (2006.01) | |
| *H03H 9/13* | (2006.01) | |

(52) U.S. Cl.
CPC .... *H03H 9/02015* (2013.01); *H03H 9/02157* (2013.01); *H03H 9/0504* (2013.01); *H03H 9/0523* (2013.01); *H03H 9/0533* (2013.01); *H03H 9/1007* (2013.01); *H03H 9/174* (2013.01); *H03H 9/176* (2013.01); *H03H 9/13* (2013.01); *H03H 2003/023* (2013.01); *Y10T 29/42* (2015.01); *Y10T 29/49005* (2015.01)

(58) Field of Classification Search
CPC ........... H03H 9/02031; H03H 9/02039; H03H 9/02133; H03H 9/02157; H03H 9/02574; H03H 9/0504; H03H 9/0523; H03H 9/0533; H03H 9/1007; H03H 9/13; H03H 9/17; H03H 9/171; H03H 9/174; H03H 9/176; H03H 9/56; H03H 9/562; H03H 9/564; H03H 9/582; H03H 2009/0248; H01L 41/0815; H01L 41/253; H01L 41/27; H01L 41/31; H01L 41/312; H01L 41/314; H01L 41/316; H01L 41/317; H01L 41/318; H01L 41/319; Y10T 29/42; Y10T 29/49005; C30B 25/183
See application file for complete search history.

(56) References Cited

U.S. PATENT DOCUMENTS

| | | | |
|---|---|---|---|
| 6,051,907 A | 4/2000 | Ylilammi | |
| 6,114,635 A | 9/2000 | Lakin et al. | |
| 6,262,637 B1 | 7/2001 | Bradley et al. | |
| 6,377,137 B1 | 4/2002 | Ruby | |
| 6,384,697 B1 | 5/2002 | Ruby | |
| 6,472,954 B1 | 10/2002 | Ruby et al. | |
| 6,617,060 B2 | 9/2003 | Weeks, Jr. et al. | |
| 6,812,619 B1 | 11/2004 | Kaitila et al. | |
| 6,841,922 B2 | 1/2005 | Aigner et al. | |
| 6,864,619 B2 | 3/2005 | Aigner et al. | |
| 6,879,224 B2 | 4/2005 | Frank | |
| 6,909,340 B2 | 6/2005 | Aigner et al. | |
| 6,933,807 B2 | 8/2005 | Marksteiner et al. | |
| 7,112,860 B2 | 9/2006 | Saxler | |
| 7,250,360 B2 | 7/2007 | Shealy et al. | |
| 7,268,436 B2 | 9/2007 | Aigner et al. | |
| 7,365,619 B2 | 4/2008 | Aigner et al. | |
| 7,514,759 B1 | 4/2009 | Mehta et al. | |
| 7,777,777 B2 | 8/2010 | Bowman et al. | |
| 7,875,910 B2 | 1/2011 | Sheppard et al. | |
| 7,982,363 B2 | 7/2011 | Chitnis | |
| 8,304,271 B2 | 11/2012 | Huang et al. | |
| 2005/0219012 A1 | 10/2005 | Frederick et al. | |
| 2005/0255234 A1 | 11/2005 | Kanda et al. | |
| 2007/0080611 A1 | 4/2007 | Yamada et al. | |
| 2008/0024042 A1 | 1/2008 | Isobe et al. | |
| 2008/0284541 A1 | 11/2008 | Chitnis | |
| 2009/0033177 A1 | 2/2009 | Itaya et al. | |
| 2011/0114968 A1 | 5/2011 | Sheppard et al. | |
| 2011/0298564 A1 | 12/2011 | Kazuki et al. | |
| 2012/0287575 A1 | 11/2012 | Nelson | |
| 2013/0176086 A1 | 7/2013 | Bradley et al. | |
| 2014/0132117 A1 | 5/2014 | Larson | |
| 2014/0327013 A1* | 11/2014 | Schenk | B82Y 20/00 257/76 |
| 2015/0022057 A1* | 1/2015 | Kim | F02M 51/0603 310/328 |
| 2015/0097638 A1 | 4/2015 | Yu et al. | |
| 2015/0357993 A1 | 12/2015 | Shealy | |
| 2016/0028367 A1 | 1/2016 | Shealy | |
| 2016/0036580 A1 | 2/2016 | Shealy | |
| 2017/0264256 A1 | 9/2017 | Gibb et al. | |
| 2018/0013405 A1 | 1/2018 | Takata | |
| 2018/0054176 A1 | 2/2018 | Kim et al. | |
| 2018/0138885 A1 | 5/2018 | Stokes et al. | |
| 2019/0081611 A1 | 3/2019 | Vetury et al. | |

FOREIGN PATENT DOCUMENTS

| | | |
|---|---|---|
| JP | 2009100197 A | 5/2009 |
| JP | 2010068109 A | 3/2010 |
| KR | 20120023285 A | 3/2012 |
| WO | WO2005034349 A1 | 4/2005 |
| WO | WO2016122877 A1 | 8/2016 |
| WO | WO2017171856 A1 | 5/2017 |
| WO | WO2017222990 A1 | 12/2017 |

OTHER PUBLICATIONS

International Search Report and Written Opinion for PCT/US2019/040729, dated Oct. 22, 2019.
International Search Report and Written Opinion for PCT/US2019/048412, dated Nov. 19, 2019.
International Search Report and Written Opinion for PCT/US2018/050521 dated Jan. 28, 2019.
International Search Report for PCT/US2019/018550, dated May 30, 2019.
International Search Report and Written Opinion for PCT/US2020023008 dated Dec. 3, 2020.

* cited by examiner

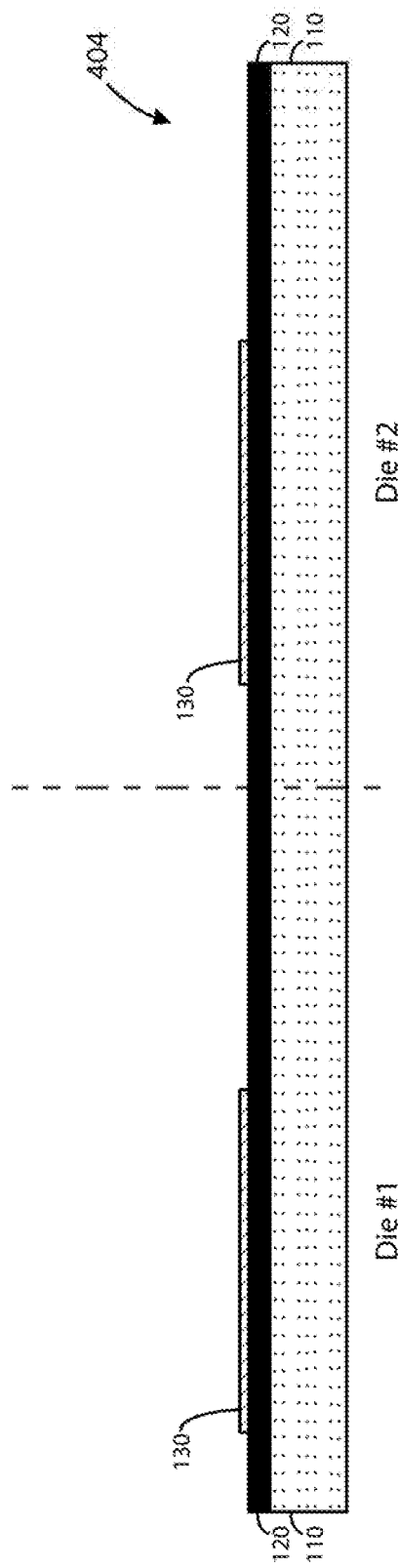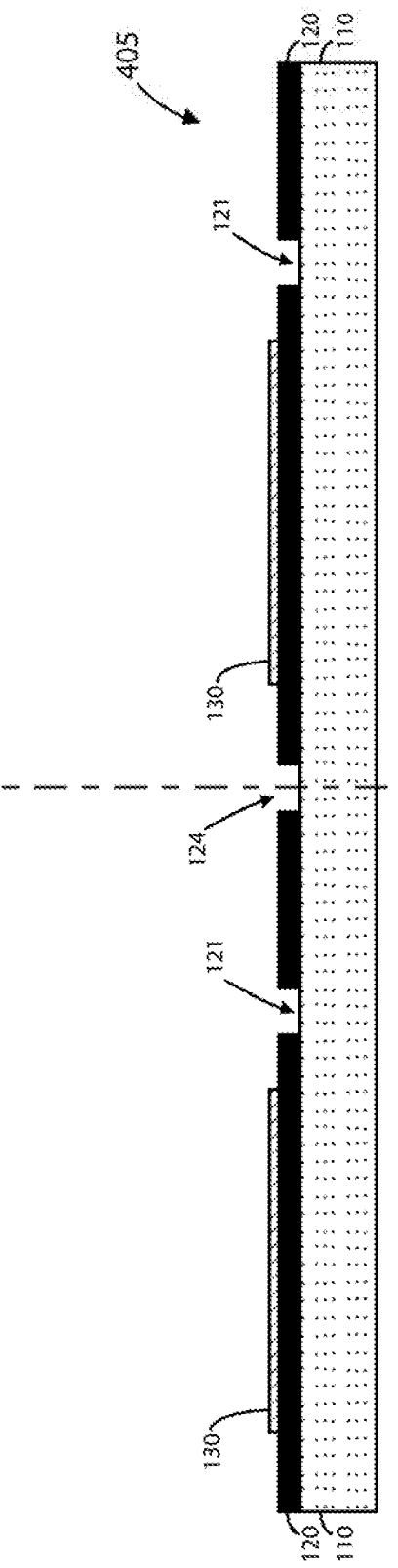

METHOD AND STRUCTURE FOR SINGLE CRYSTAL ACOUSTIC RESONATOR DEVICES USING THERMAL RECRYSTALLIZATION

CROSS-REFERENCES TO RELATED APPLICATIONS

The present application claims priority to and is a continuation of U.S. patent application Ser. No. 16/035,577, filed Jul. 13, 2018, which is a continuation-in-part application of U.S. patent application Ser. No. 15/221,358, filed Jul. 27, 2016, which is a continuation-in-part of U.S. patent application Ser. No. 15/068,510, filed Mar. 11, 2016, now issued as U.S. Pat. No. 10,217,930 on Feb. 26, 2019. The present application also incorporates by reference, for all purposes, the following concurrently filed patent applications, all commonly owned: U.S. patent application Ser. No. 14/298,057, titled "RESONANCE CIRCUIT WITH A SINGLE CRYSTAL CAPACITOR DIELECTRIC MATERIAL," filed Jun. 2, 2014, U.S. patent application Ser. No. 14/298,076, titled "METHOD OF MANUFACTURE FOR SINGLE CRYSTAL CAPACITOR DIELECTRIC FOR A RESONANCE CIRCUIT," filed Jun. 2, 2014, U.S. patent application Ser. No. 14/298,100, titled "INTEGRATED CIRCUIT CONFIGURED WITH TWO OR MORE SINGLE CRYSTAL ACOUSTIC RESONATOR DEVICES," filed Jun. 2, 2014, U.S. patent application Ser. No. 14/341,314, titled "WAFER SCALE PACKAGING," filed Jul. 25, 2014, U.S. patent application Ser. No. 14/449,001, titled "MOBILE COMMUNICATION DEVICE CONFIGURED WITH A SINGLE CRYSTAL PIEZO RESONATOR STRUCTURE," filed Jul. 31, 2014, and U.S. patent application Ser. No. 14/469,503, titled "MEMBRANE SUBSTRATE STRUCTURE FOR SINGLE CRYSTAL ACOUSTIC RESONATOR DEVICE," filed Aug. 26, 2014.

BACKGROUND OF THE INVENTION

The present invention relates generally to electronic devices. More particularly, the present invention provides techniques related to a method of manufacture for bulk acoustic wave resonator devices, single crystal bulk acoustic wave resonator devices, single crystal filter and resonator devices, and the like. Merely by way of example, the invention has been applied to a single crystal resonator device for a communication device, mobile device, computing device, among others.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2B per annum within the next few years. Coexistence of new and legacy standards and thirst for higher data rate requirements is driving RF complexity in smartphones. Unfortunately, limitations exist with conventional RF technology that is problematic, and may lead to drawbacks in the future.

From the above, it is seen that techniques for improving electronic devices are highly desirable.

BRIEF SUMMARY OF THE INVENTION

According to the present invention, techniques generally related to electronic devices are provided. More particularly, the present invention provides techniques related to a method of manufacture for bulk acoustic wave resonator devices, single crystal resonator devices, single crystal filter and resonator devices, and the like. Merely by way of example, the invention has been applied to a single crystal resonator device for a communication device, mobile device, computing device, among others.

In an example, the present invention provides a method of manufacture for an acoustic resonator device. The method includes forming a nucleation layer characterized by nucleation growth parameters overlying a substrate and forming a strained piezoelectric layer overlying the nucleation layer. The strained piezoelectric layer is characterized by a strain condition and piezoelectric layer parameters. The process of forming the strained piezoelectric layer can include an epitaxial growth process configured by nucleation growth parameters and piezoelectric layer parameters to modulate the strain condition in the strained piezoelectric layer. By modulating the strain condition, the piezoelectric properties of the piezoelectric layer can be adjusted and improved for specific applications.

In an embodiment, the present invention provides a method and structure for a full (hybrid) stack acoustic resonator device that includes at least a strained single crystal layer and a poly crystal layer. The poly crystal layer can be formed using the strained single crystal layer as a seed substrate. The poly crystal film can be thermally treated to drive crystallization of the polycrystalline thin film to improve the crystalline quality and enhance piezoelectric properties. The hybrid approach allows for the enhancement of device materials and performance beyond devices using typical textured polycrystalline methods or techniques.

One or more benefits are achieved over pre-existing techniques using the invention. In particular, the present device can be manufactured in a relatively simple and cost effective manner while using conventional materials and/or methods according to one of ordinary skill in the art. Using the present method, one can create a reliable single crystal based acoustic filter or resonator using multiple ways of three-dimensional stacking through a wafer level process or an acoustic resonator with a hybrid thermally recrystallized polycrystalline and single crystalline piezo stack. An acoustic resonator implementing the present hybrid piezoelectric stack can exhibit improved electromechanical coupling (k2) and enable wide bandwidth filter performance. Such filters or resonators can be implemented in an RF filter device, an RF filter system, or the like. Depending upon the embodiment, one or more of these benefits may be achieved.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 4D and 4E are simplified diagrams illustrating an alternative method for conducting the method step of forming a topside micro-trench as described in FIG. 4A.

DETAILED DESCRIPTION OF THE INVENTION

According to the present invention, techniques generally related to electronic devices are provided. More particularly, the present invention provides techniques related to a single crystal acoustic resonator using wafer level technologies. Merely by way of example, the invention has been applied to a resonator device for a communication device, mobile device, computing device, among others.

Figure 1A:
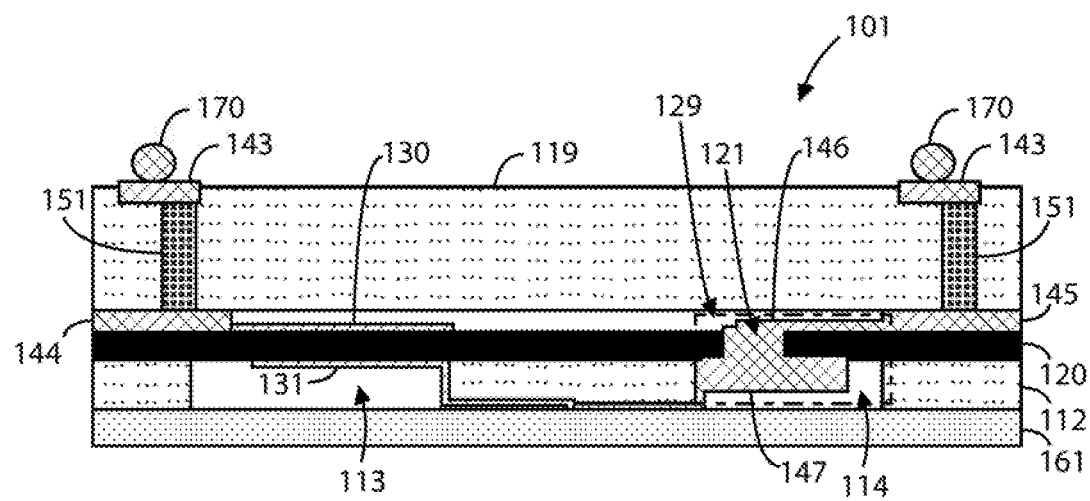
FIG. 1A is a simplified diagram illustrating an acoustic resonator device having topside interconnections according to an example of the present invention.

FIG. 1A is a simplified diagram illustrating an acoustic resonator device 101 having topside interconnections according to an example of the present invention. As shown, device 101 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 101 is depicted with a single micro-via 129, device 101 may have multiple micro-vias. A topside metal electrode 130 is formed overlying the piezoelectric layer 120. A top cap structure is bonded to the piezoelectric layer 120. This top cap structure includes an interposer substrate 119 with one or more through-vias 151 that are connected to one or more top bond pads 143, one or more bond pads 144, and topside metal 145 with topside metal plug 146. Solder balls 170 are electrically coupled to the one or more top bond pads 143.

The thinned substrate 112 has the first and second backside trenches 113, 114. A backside metal electrode 131 is formed underlying a portion of the thinned seed substrate 112, the first backside trench 113, and the topside metal electrode 130. The backside metal plug 147 is formed underlying a portion of the thinned seed substrate 112, the second backside trench 114, and the topside metal 145. This backside metal plug 147 is electrically coupled to the topside metal plug 146 and the backside metal electrode 131. A backside cap structure 161 is bonded to the thinned seed substrate 112, underlying the first and second backside trenches 113, 114. Further details relating to the method of manufacture of this device will be discussed starting from FIG. 2.

Figure 1B:
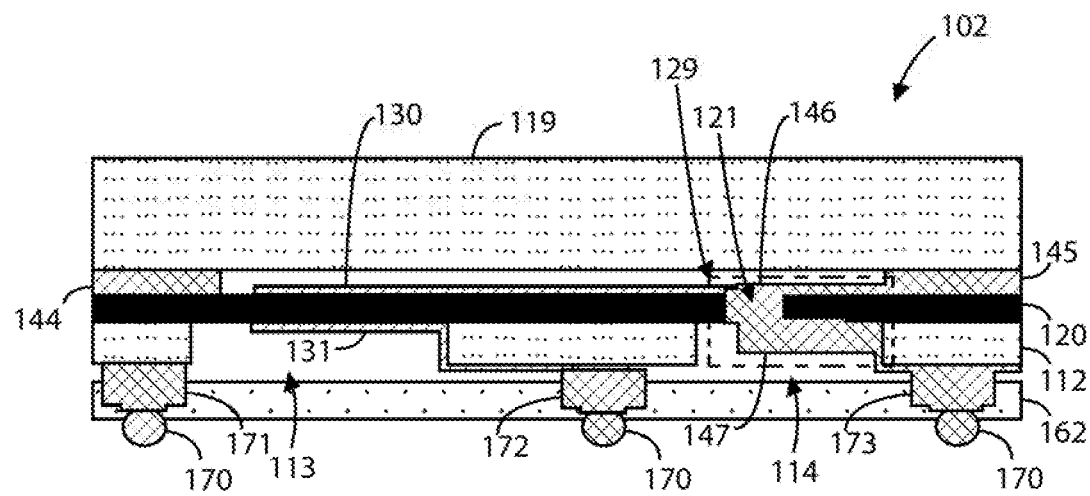
FIG. 1B is a simplified diagram illustrating an acoustic resonator device having bottom-side interconnections according to an example of the present invention.

FIG. 1B is a simplified diagram illustrating an acoustic resonator device 102 having backside interconnections according to an example of the present invention. As shown, device 101 includes a thinned seed substrate 112 with an overlying piezoelectric layer 120, which has a micro-via 129. The micro-via 129 can include a topside micro-trench 121, a topside metal plug 146, a backside trench 114, and a backside metal plug 147. Although device 102 is depicted with a single micro-via 129, device 102 may have multiple micro-vias. A topside metal electrode 130 is formed overlying the piezoelectric layer 120. A top cap structure is bonded to the piezoelectric layer 120. This top cap structure 119 includes bond pads which are connected to one or more bond pads 144 and topside metal 145 on piezoelectric layer 120. The topside metal 145 includes a topside metal plug 146.

The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal plug 146. This backside metal plug 147 is electrically coupled to the topside metal plug 146. A backside cap structure 162 is bonded to the thinned seed substrate 112, underlying the first and second backside trenches. One or more backside bond pads (171, 172, 173) are formed within one or more portions of the backside cap structure 162. Solder balls 170 are electrically coupled to the one or more backside bond pads 171-173. Further details relating to the method of manufacture of this device will be discussed starting from FIG. 14A.

Figure 1C:
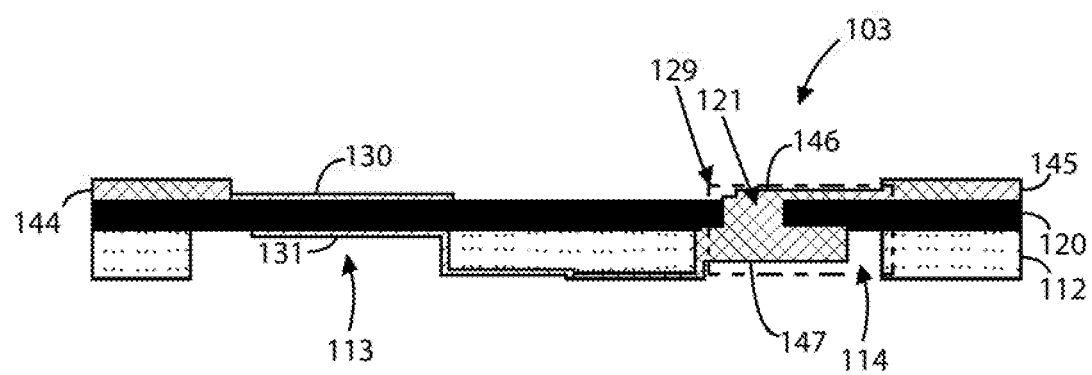
FIG. 1C is a simplified diagram illustrating an acoustic resonator device having interposer/cap-free structure interconnections according to an example of the present invention.

FIG. 1C is a simplified diagram illustrating an acoustic resonator device having interposer/cap-free structure interconnections according to an example of the present invention. As shown, device 103 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 103 is depicted with a single micro-via 129, device 103 may have multiple micro-vias. A topside metal electrode 130 is formed overlying the piezoelectric layer 120. The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal 145. This backside metal plug 147 is electrically coupled to the topside metal plug 146 and the backside metal electrode 131. Further details relating to the method of manufacture of this device will be discussed starting from FIG. 2.

Figure 1D:
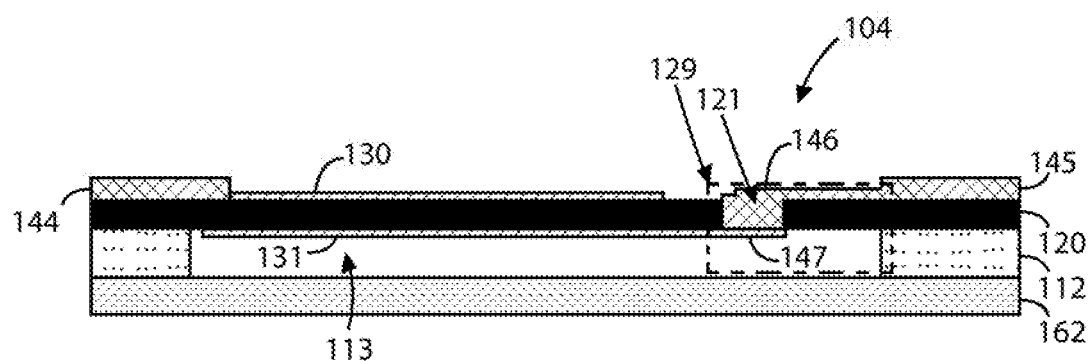
FIG. 1D is a simplified diagram illustrating an acoustic resonator device having interposer/cap-free structure interconnections with a shared backside trench according to an example of the present invention.

FIG. 1D is a simplified diagram illustrating an acoustic resonator device having interposer/cap-free structure interconnections with a shared backside trench according to an example of the present invention. As shown, device 104 includes a thinned seed substrate 112 with an overlying single crystal piezoelectric layer 120, which has a micro-via 129. The micro-via 129 can include a topside micro-trench 121, a topside metal plug 146, and a backside metal 147. Although device 104 is depicted with a single micro-via 129, device 104 may have multiple micro-vias. A topside metal electrode 130 is formed overlying the piezoelectric layer 120. The thinned substrate 112 has a first backside trench 113. A backside metal electrode 131 is formed underlying a portion of the thinned seed substrate 112, the first backside trench 113, and the topside metal electrode 130. A backside metal 147 is formed underlying a portion of the thinned seed substrate 112, the second backside trench 114, and the topside metal 145. This backside metal 147 is electrically coupled to the topside metal plug 146 and the backside metal electrode 131. Further details relating to the method of manufacture of this device will be discussed starting from FIG. 2.

Figure 2:
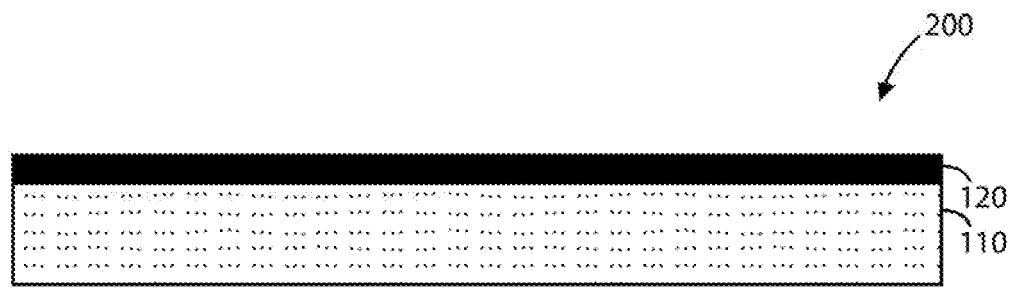
FIGS. 2 and 3 are simplified diagrams illustrating steps for a method of manufacture for an acoustic resonator device according to an example of the present invention.
Figure 3:
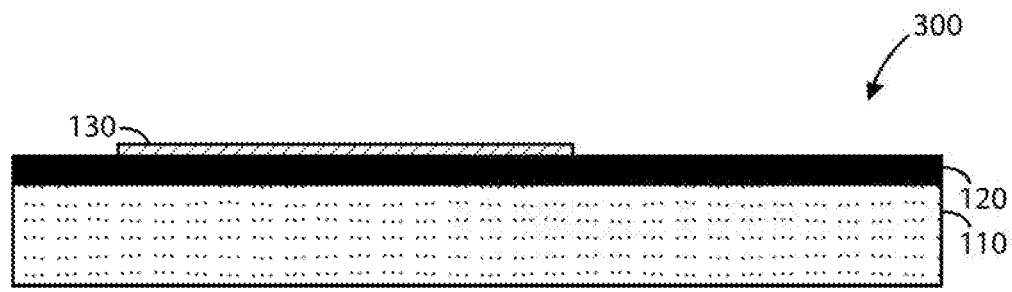

FIGS. 2 and 3 are simplified diagrams illustrating steps for a method of manufacture for an acoustic resonator device according to an example of the present invention. This method illustrates the process for fabricating an acoustic resonator device similar to that shown in FIG. 1A. FIG. 2 can represent a method step of providing a partially processed piezoelectric substrate. As shown, device 102 includes a seed substrate 110 with a piezoelectric layer 120 formed overlying. In a specific example, the seed substrate can include silicon, silicon carbide, aluminum oxide, or single crystal aluminum gallium nitride materials, or the like. The piezoelectric layer 120 can include a piezoelectric single crystal layer or a thin film piezoelectric single crystal layer.

FIG. 3 can represent a method step of forming a top side metallization or top resonator metal electrode 130. In a specific example, the topside metal electrode 130 can include a molybdenum, aluminum, ruthenium, or titanium material, or the like and combinations thereof. This layer can be deposited and patterned on top of the piezoelectric layer by a lift-off process, a wet etching process, a dry etching process, a metal printing process, a metal laminating process, or the like. The lift-off process can include a sequential process of lithographic patterning, metal deposition, and lift-off steps to produce the topside metal layer. The wet/dry etching processes can includes sequential processes of metal deposition, lithographic patterning, metal deposition, and metal etching steps to produce the topside metal layer. Those of ordinary skill in the art will recognize other variations, modifications, and alternatives.

Figure 4A:
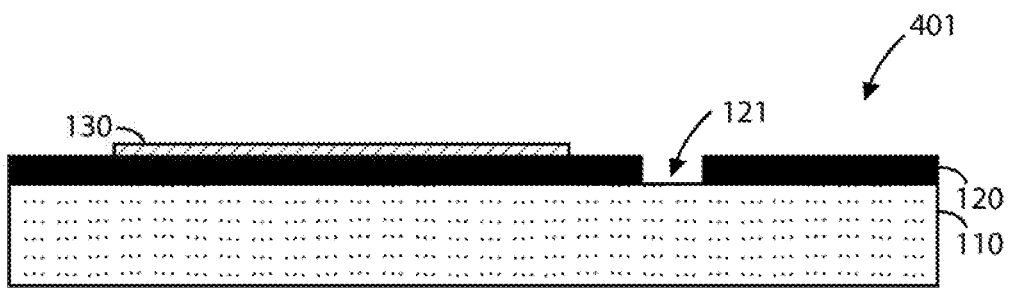
FIG. 4A is a simplified diagram illustrating a step for a method creating a topside micro-trench according to an example of the present invention.
Figure 4B:
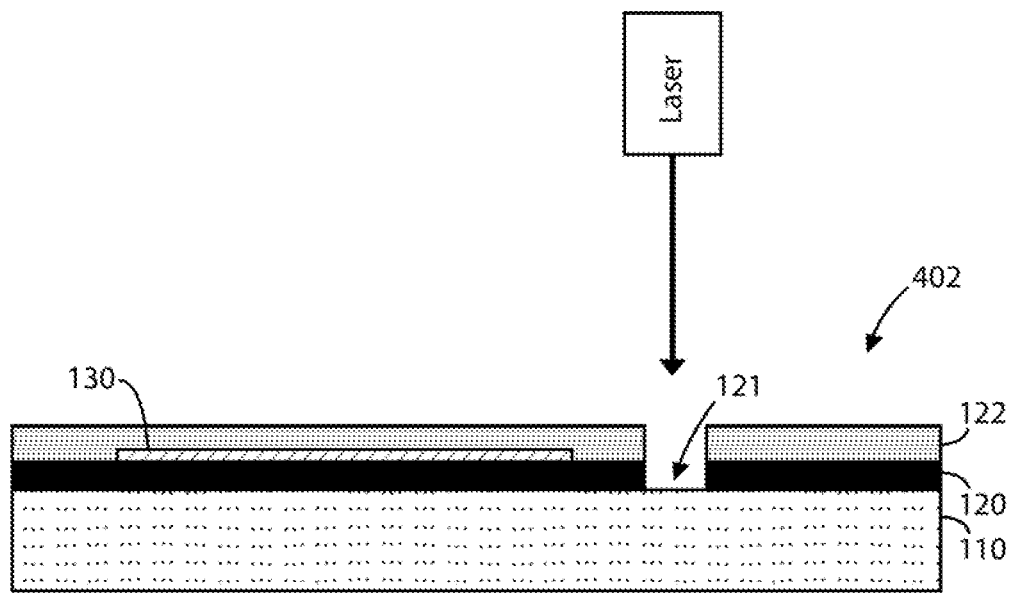
FIGS. 4B and 4C are simplified diagrams illustrating alternative methods for conducting the method step of forming a topside micro-trench as described in FIG. 4A.
Figure 4C:
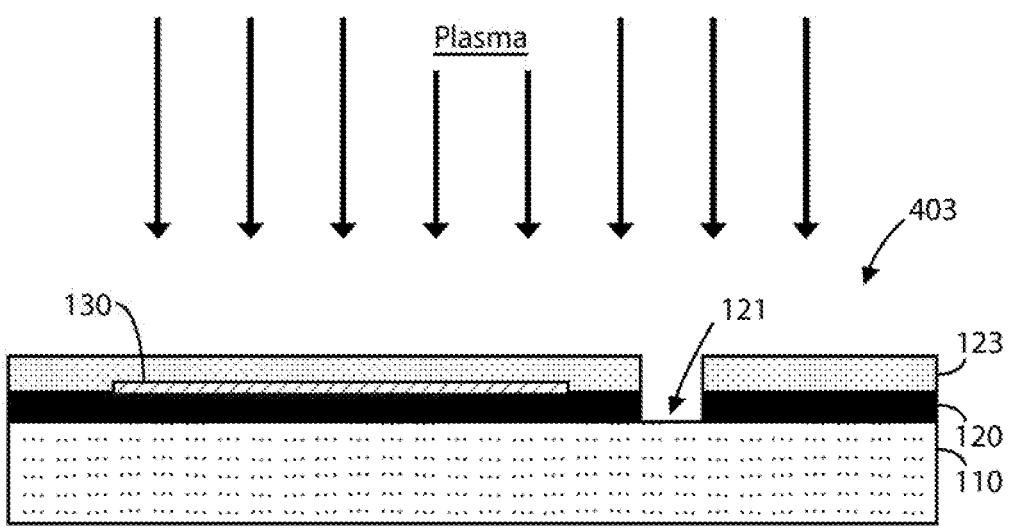

FIG. 4A is a simplified diagram illustrating a step for a method of manufacture for an acoustic resonator device 401 according to an example of the present invention. This figure can represent a method step of forming one or more topside micro-trenches 121 within a portion of the piezoelectric layer 120. This topside micro-trench 121 can serve as the main interconnect junction between the top and bottom sides of the acoustic membrane, which will be developed in later method steps. In an example, the topside micro-trench 121 is extends all the way through the piezoelectric layer 120 and stops in the seed substrate 110. This topside micro-trench 121 can be formed through a dry etching process, a laser drilling process, or the like. FIGS. 4B and 4C describe these options in more detail.

FIGS. 4B and 4C are simplified diagrams illustrating alternative methods for conducting the method step as described in FIG. 4A. As shown, FIG. 4B represents a method step of using a laser drill, which can quickly and accurately form the topside micro-trench 121 in the piezoelectric layer 120. In an example, the laser drill can be used to form nominal 50 um holes, or holes between 10 um and 500 um in diameter, through the piezoelectric layer 120 and stop in the seed substrate 110 below the interface between layers 120 and 110. A protective layer 122 can be formed overlying the piezoelectric layer 120 and the topside metal electrode 130. This protective layer 122 can serve to protect the device from laser debris and to provide a mask for the etching of the topside micro-via 121. In a specific example, the laser drill can be an 11W high power diode-pumped UV laser, or the like. This mask 122 can be subsequently removed before proceeding to other steps. The mask may also be omitted from the laser drilling process, and air flow can be used to remove laser debris.

FIG. 4C can represent a method step of using a dry etching process to form the topside micro-trench 121 in the piezoelectric layer 120. As shown, a lithographic masking layer 123 can be forming overlying the piezoelectric layer 120 and the topside metal electrode 130. The topside micro-trench 121 can be formed by exposure to plasma, or the like.

FIGS. 4D and 4E are simplified diagrams illustrating an alternative method for conducting the method step as described in FIG. 4A. These figures can represent the method step of manufacturing multiple acoustic resonator devices simultaneously. In FIG. 4D, two devices are shown on Die #1 and Die #2, respectively. FIG. 4E shows the process of forming a micro-via 121 on each of these dies while also etching a scribe line 124 or dicing line. In an example, the etching of the scribe line 124 singulates and relieves stress in the piezoelectric single crystal layer 120.

Figure 5:
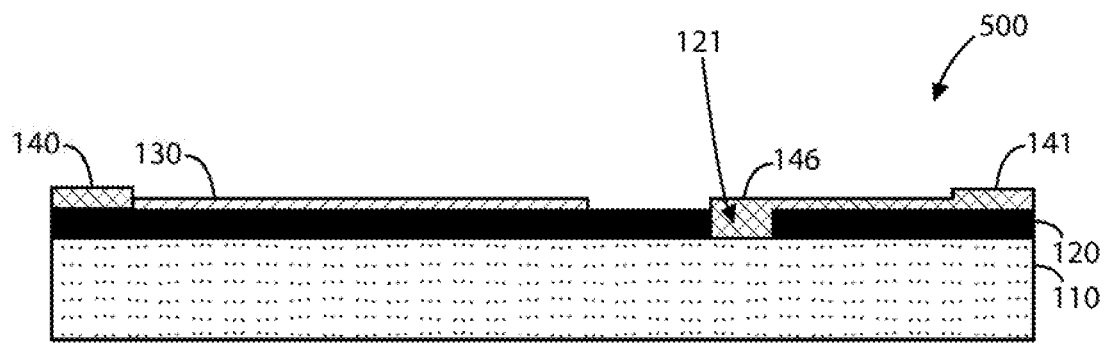
FIGS. 5 to 8 are simplified diagrams illustrating steps for a method of manufacture for an acoustic resonator device according to an example of the present invention.

FIGS. 5 to 8 are simplified diagrams illustrating steps for a method of manufacture for an acoustic resonator device according to an example of the present invention. FIG. 5 can represent the method step of forming one or more bond pads 140 and forming a topside metal 141 electrically coupled to at least one of the bond pads 140. The topside metal 141 can include a topside metal plug 146 formed within the topside micro-trench 121. In a specific example, the topside metal plug 146 fills the topside micro-trench 121 to form a topside portion of a micro-via.

In an example, the bond pads 140 and the topside metal 141 can include a gold material or other interconnect metal material depending upon the application of the device. These metal materials can be formed by a lift-off process, a wet etching process, a dry etching process, a screen-printing process, an electroplating process, a metal printing process, or the like. In a specific example, the deposited metal materials can also serve as bond pads for a cap structure, which will be described below.

Figure 6:
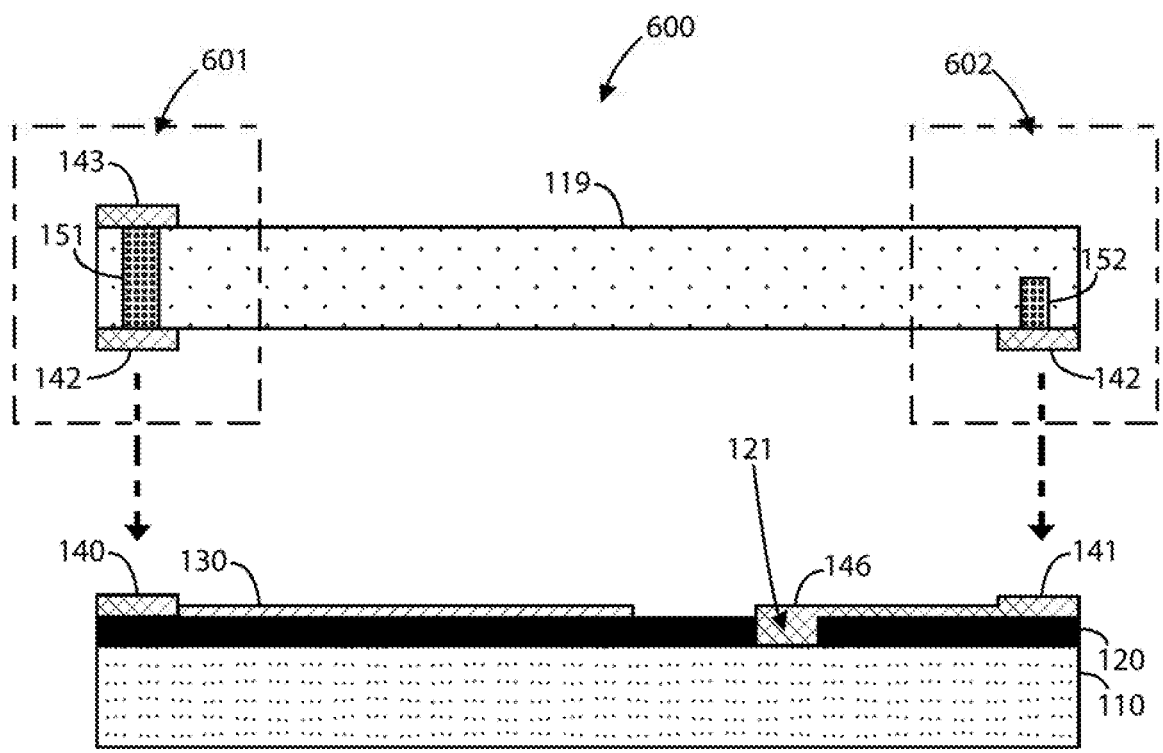

FIG. 6 can represent a method step for preparing the acoustic resonator device for bonding, which can be a hermetic bonding. As shown, a top cap structure is positioned above the partially processed acoustic resonator device as described in the previous figures. The top cap structure can be formed using an interposer substrate 119 in two configurations: fully processed interposer version 601 (through glass via) and partially processed interposer version 602 (blind via version). In the 601 version, the interposer substrate 119 includes through-via structures 151 that extend through the interposer substrate 119 and are electrically coupled to bottom bond pads 142 and top bond pads 143. In the 602 version, the interposer substrate 119 includes blind via structures 152 that only extend through a portion of the interposer substrate 119 from the bottom side. These blind via structures 152 are also electrically coupled to bottom bond pads 142. In a specific example, the interposer substrate can include a silicon, glass, smart-glass, or other like material.

Figure 7:
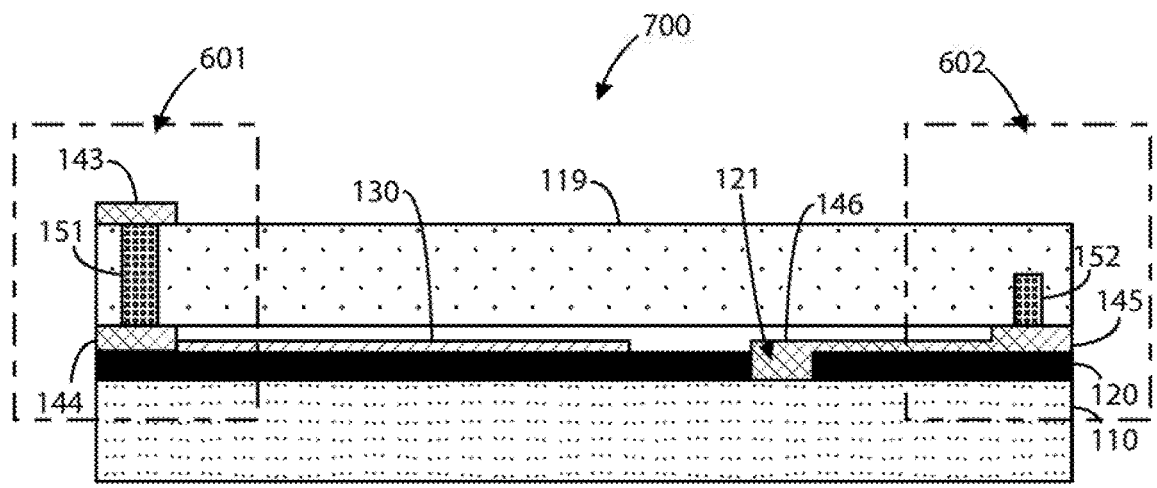
Figure 8:
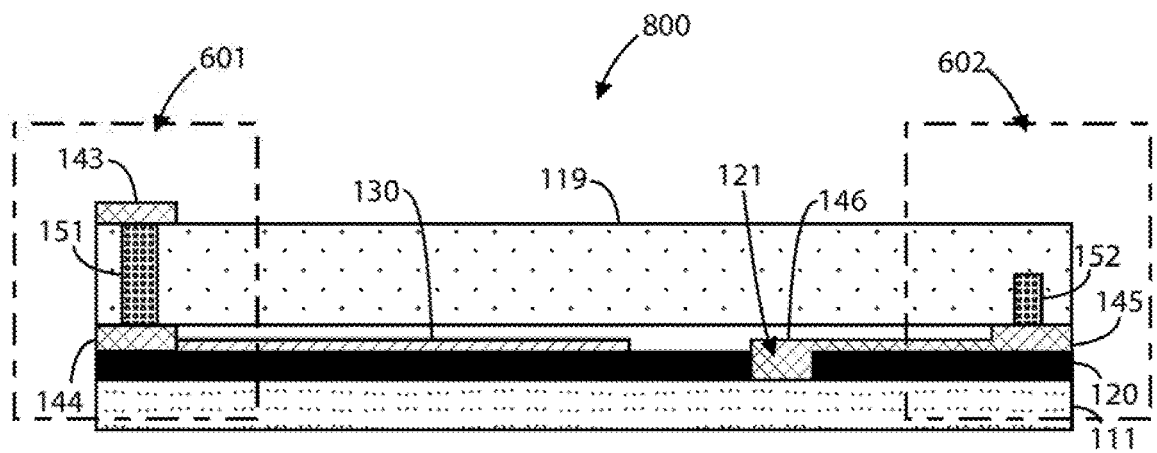

FIG. 7 can represent a method step of bonding the top cap structure to the partially processed acoustic resonator device. As shown, the interposer substrate 119 is bonded to the piezoelectric layer by the bond pads (140, 142) and the topside metal 141, which are now denoted as bond pad 144 and topside metal 145. This bonding process can be done using a compression bond method or the like. FIG. 8 can represent a method step of thinning the seed substrate 110, which is now denoted as thinned seed substrate 111. This substrate thinning process can include grinding and etching processes or the like. In a specific example, this process can include a wafer backgrinding process followed by stress removal, which can involve dry etching, CM' polishing, or annealing processes.

Figure 9A:
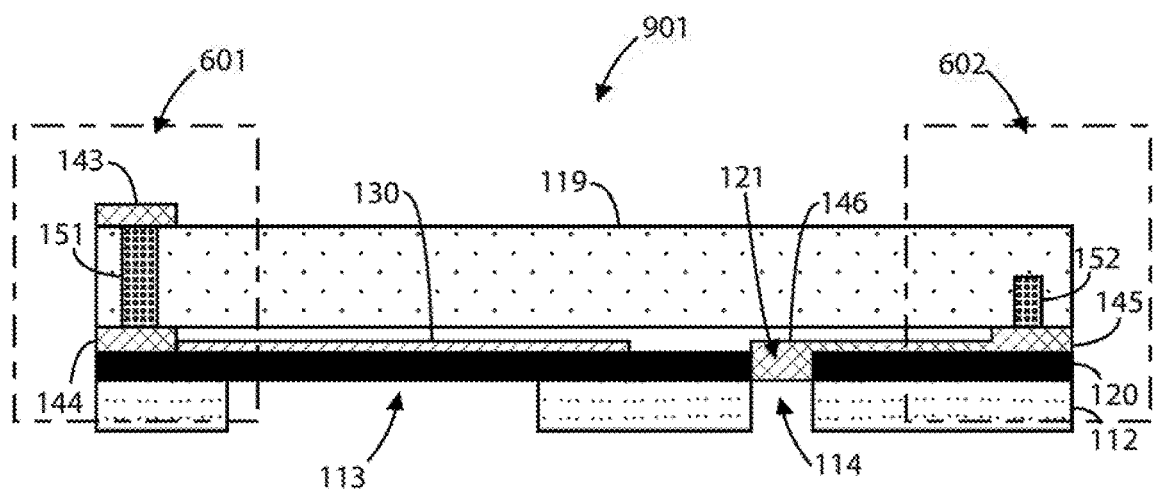
FIG. 9A is a simplified diagram illustrating a method step for forming backside trenches according to an example of the present invention.

FIG. 9A is a simplified diagram illustrating a step for a method of manufacture for an acoustic resonator device 901 according to an example of the present invention. FIG. 9A can represent a method step for forming backside trenches 113 and 114 to allow access to the piezoelectric layer from the backside of the thinned seed substrate 111. In an example, the first backside trench 113 can be formed within the thinned seed substrate 111 and underlying the topside metal electrode 130. The second backside trench 114 can be formed within the thinned seed substrate 111 and underlying the topside micro-trench 121 and topside metal plug 146. This substrate is now denoted thinned substrate 112. In a specific example, these trenches 113 and 114 can be formed using deep reactive ion etching (DRIE) processes, Bosch processes, or the like. The size, shape, and number of the trenches may vary with the design of the acoustic resonator device. In various examples, the first backside trench may be formed with a trench shape similar to a shape of the topside metal electrode or a shape of the backside metal electrode. The first backside trench may also be formed with a trench shape that is different from both a shape of the topside metal electrode and the backside metal electrode.

Figure 9B:
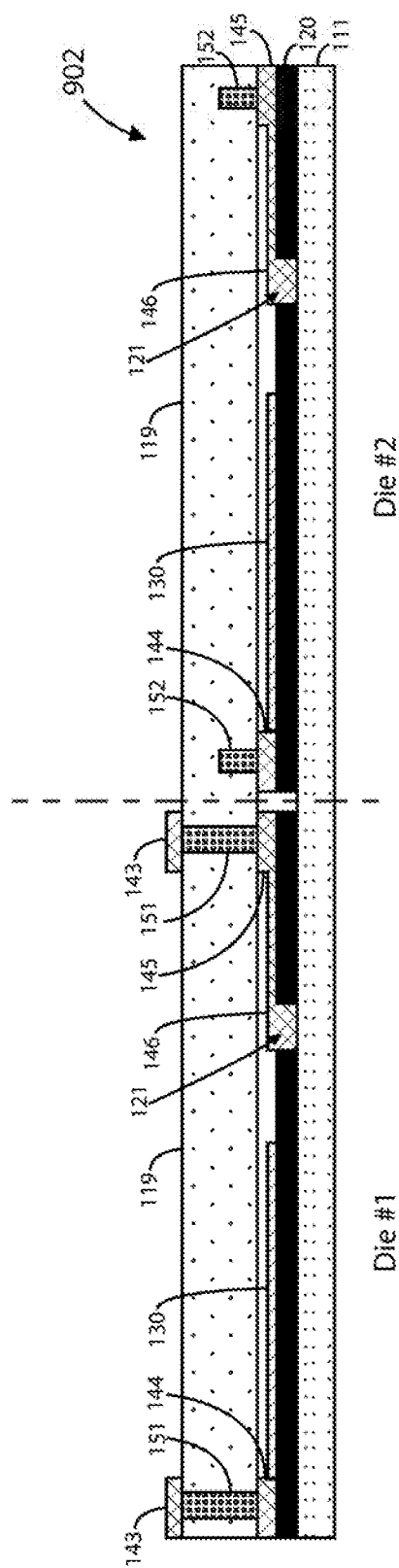
FIGS. 9B and 9C are simplified diagrams illustrating an alternative method for conducting the method step of forming backside trenches, as described in FIG. 9A, and simultaneously singulating a seed substrate according to an example of the present invention.
Figure 9C:
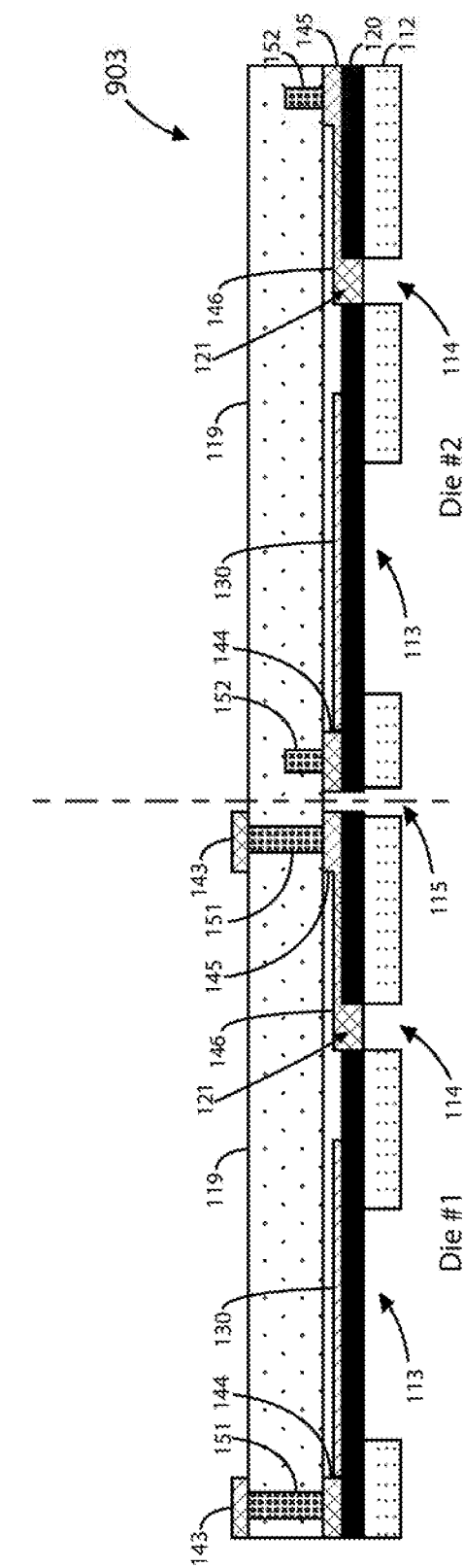

FIGS. 9B and 9C are simplified diagrams illustrating an alternative method for conducting the method step as described in FIG. 9A. Like FIGS. 4D and 4E, these figures can represent the method step of manufacturing multiple acoustic resonator devices simultaneously. In FIG. 9B, two devices with cap structures are shown on Die #1 and Die #2, respectively. FIG. 9C shows the process of forming backside trenches (113, 114) on each of these dies while also etching a scribe line 115 or dicing line. In an example, the etching of the scribe line 115 provides an optional way to singulate the backside wafer 112.

Figure 10:
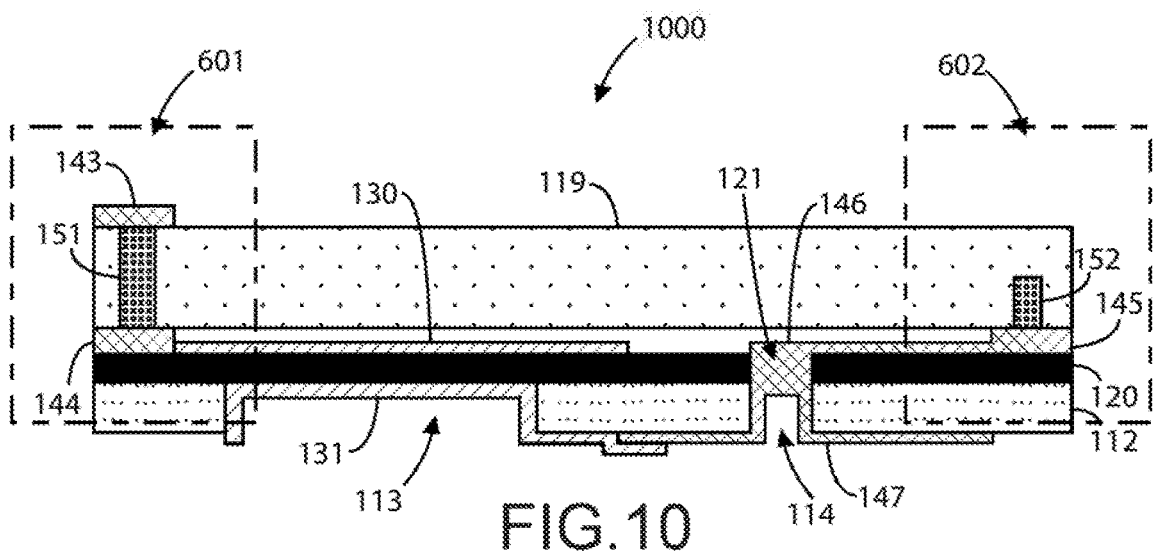
FIG. 10 is a simplified diagram illustrating a method step forming backside metallization and electrical interconnections between top and bottom sides of a resonator according to an example of the present invention.

FIG. 10 is a simplified diagram illustrating a step for a method of manufacture for an acoustic resonator device 1000 according to an example of the present invention. This figure can represent a method step of forming a backside metal electrode 131 and a backside metal plug 147 within the backside trenches of the thinned seed substrate 112. In an example, the backside metal electrode 131 can be formed underlying one or more portions of the thinned substrate 112, within the first backside trench 113, and underlying the topside metal electrode 130. This process completes the resonator structure within the acoustic resonator device. The backside metal plug 147 can be formed underlying one or more portions of the thinned substrate 112, within the second backside trench 114, and underlying the topside micro-trench 121. The backside metal plug 147 can be electrically coupled to the topside metal plug 146 and the backside metal electrode 131. In a specific example, the backside metal electrode 130 can include a molybdenum, aluminum, ruthenium, or titanium material, or the like and combinations thereof. The backside metal plug can include a gold material, low resistivity interconnect metals, electrode metals, or the like. These layers can be deposited using the deposition methods described previously.

Figure 11A:
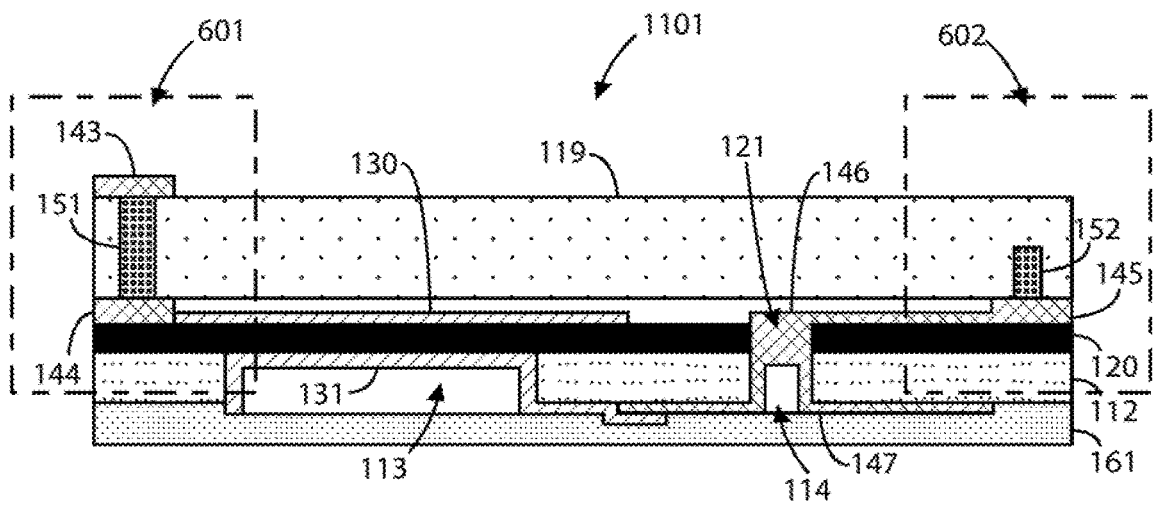
FIGS. 11A and 11B are simplified diagrams illustrating alternative steps for a method of manufacture for an acoustic resonator device according to an example of the present invention.
Figure 11B:
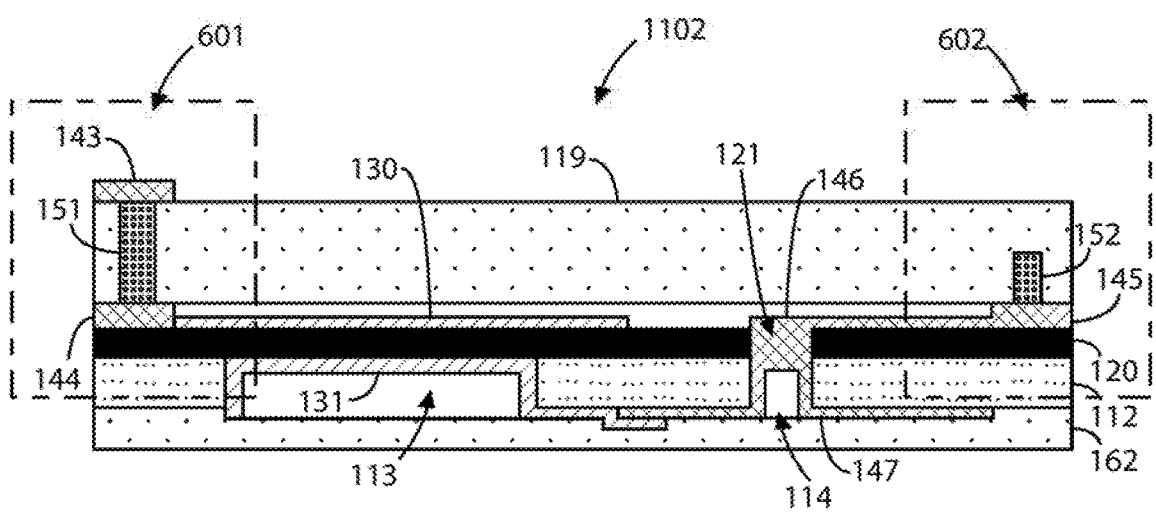

FIGS. 11A and 11B are simplified diagrams illustrating alternative steps for a method of manufacture for an acoustic resonator device according to an example of the present invention. These figures show methods of bonding a backside cap structure underlying the thinned seed substrate 112. In FIG. 11A, the backside cap structure is a dry film cap 161, which can include a permanent photo-imageable dry film such as a solder mask, polyimide, or the like. Bonding this cap structure can be cost-effective and reliable, but may not produce a hermetic seal. In FIG. 11B, the backside cap structure is a substrate 162, which can include a silicon, glass, or other like material. Bonding this substrate can provide a hermetic seal, but may cost more and require additional processes. Depending upon application, either of these backside cap structures can be bonded underlying the first and second backside vias.

Figure 12A:
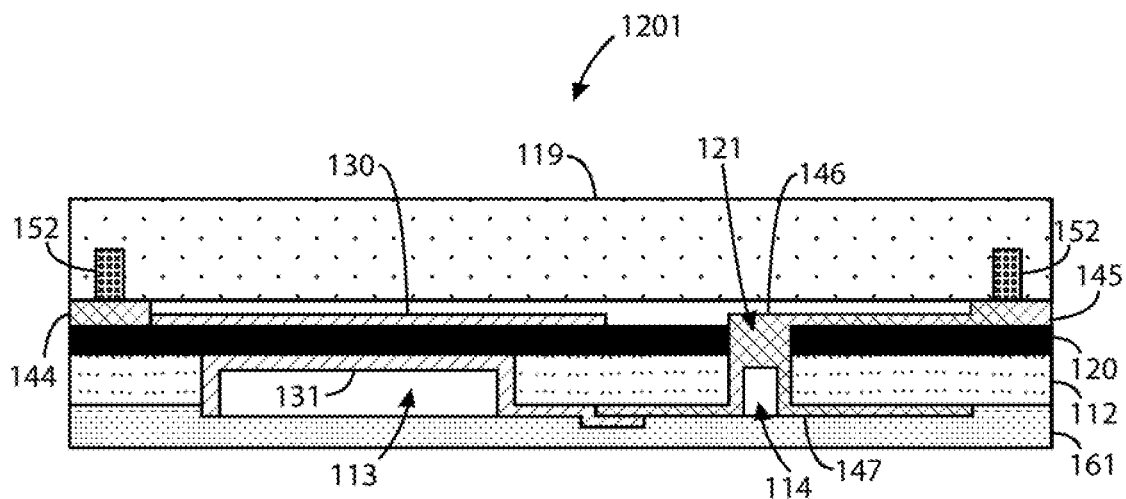
FIGS. 12A to 12E are simplified diagrams illustrating steps for a method of manufacture for an acoustic resonator device using a blind via interposer according to an example of the present invention.
Figure 12B:
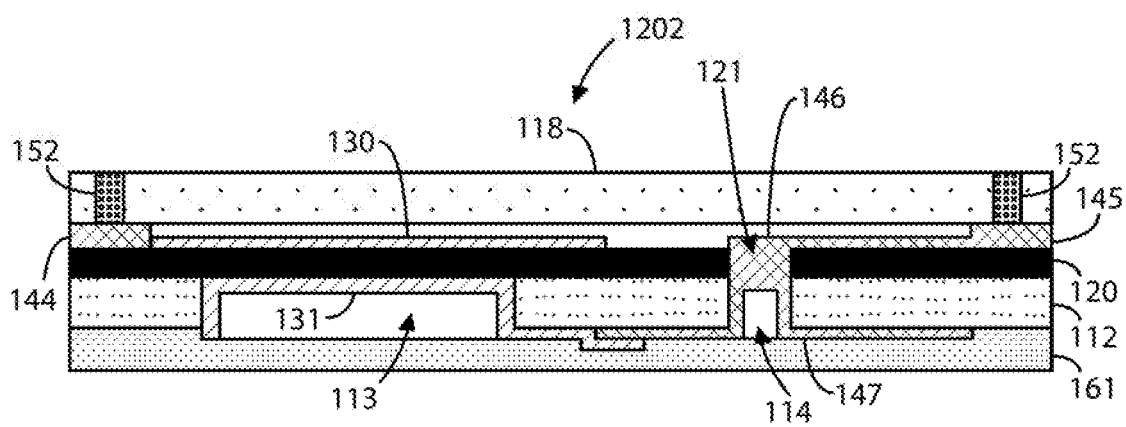
Figure 12C:
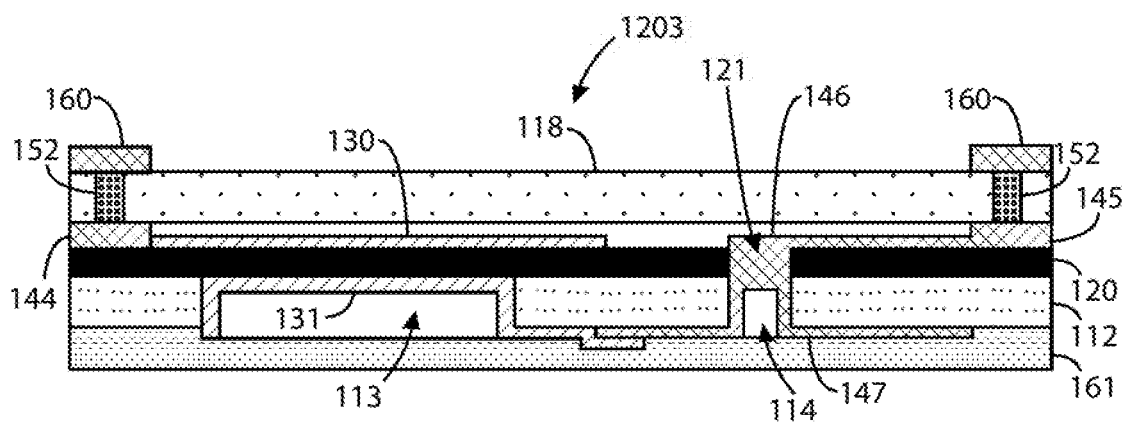
Figure 12D:
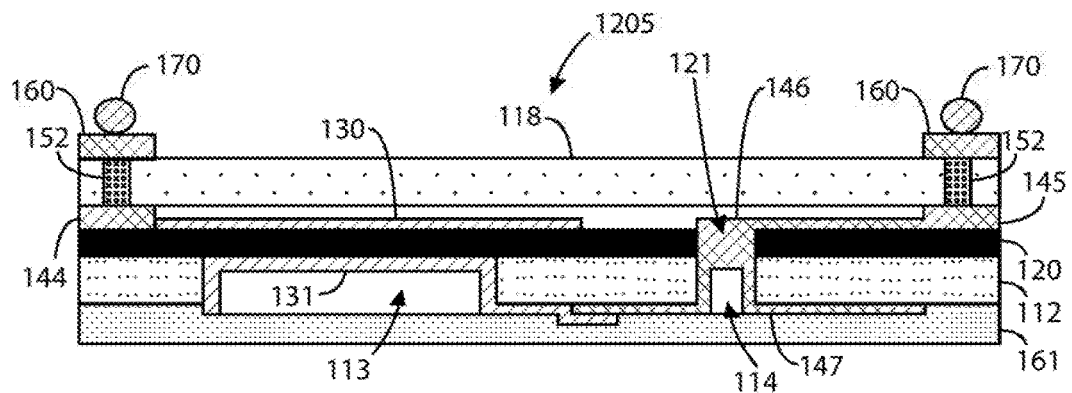
Figure 12E:
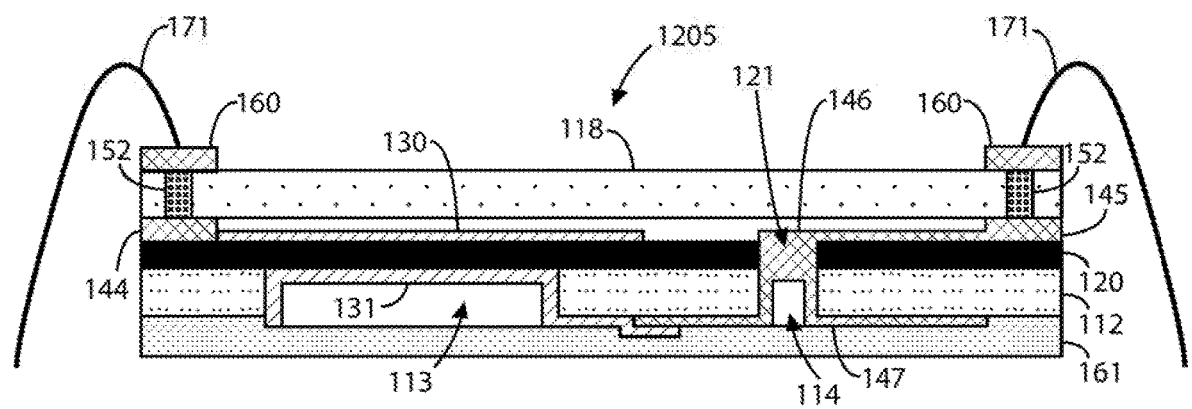

FIGS. 12A to 12E are simplified diagrams illustrating steps for a method of manufacture for an acoustic resonator device according to an example of the present invention. More specifically, these figures describe additional steps for processing the blind via interposer "602" version of the top cap structure. FIG. 12A shows an acoustic resonator device 1201 with blind vias 152 in the top cap structure. In FIG. 12B, the interposer substrate 119 is thinned, which forms a thinned interposer substrate 118, to expose the blind vias 152. This thinning process can be a combination of a grinding process and etching process as described for the thinning of the seed substrate. In FIG. 12C, a redistribution layer (RDL) process and metallization process can be applied to create top cap bond pads 160 that are formed overlying the blind vias 152 and are electrically coupled to the blind vias 152. As shown in FIG. 12D, a ball grid array (BGA) process can be applied to form solder balls 170 overlying and electrically coupled to the top cap bond pads 160. This process leaves the acoustic resonator device ready for wire bonding 171, as shown in FIG. 12E.

Figure 13:
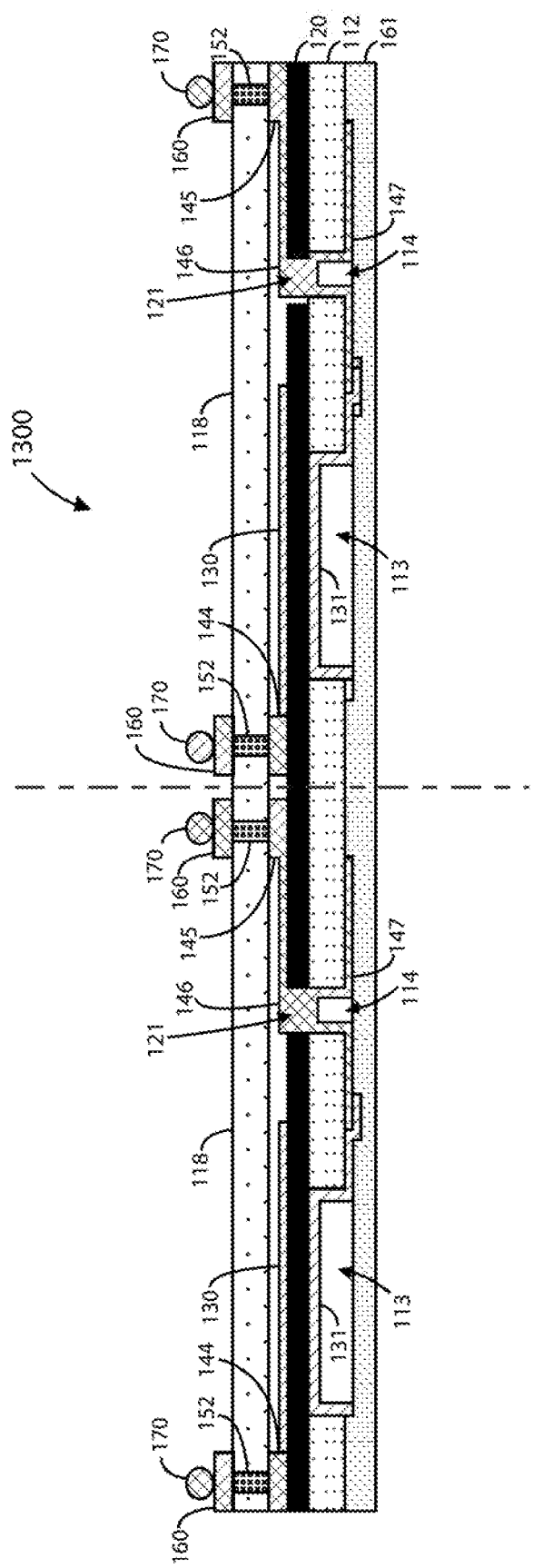
FIG. 13 is a simplified diagram illustrating a step for a method of manufacture for an acoustic resonator device according to an example of the present invention.

FIG. 13 is a simplified diagram illustrating a step for a method of manufacture for an acoustic resonator device according to an example of the present invention. As shown, device 1300 includes two fully processed acoustic resonator devices that are ready to singulation to create separate devices. In an example, the die singulation process can be done using a wafer dicing saw process, a laser cut singulation process, or other processes and combinations thereof.

Figure 14A:
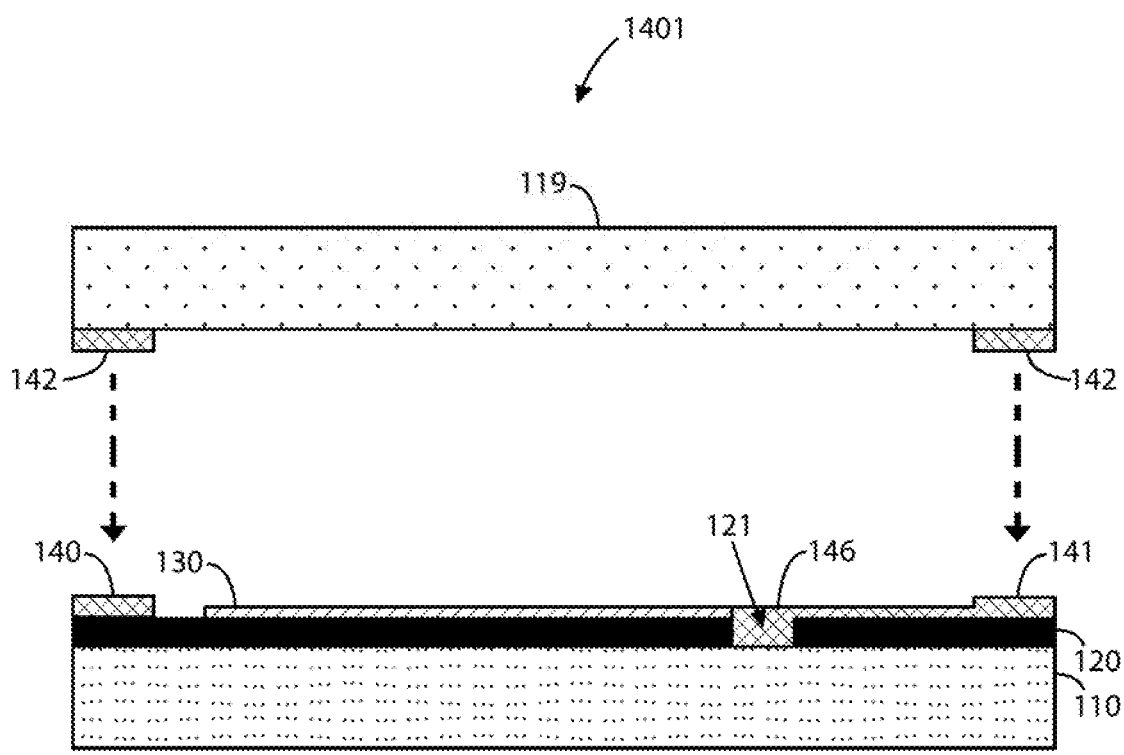
FIGS. 14A to 14G are simplified diagrams illustrating method steps for a cap wafer process for an acoustic resonator device according to an example of the present invention.

FIGS. 14A to 14G are simplified diagrams illustrating steps for a method of manufacture for an acoustic resonator device according to an example of the present invention. This method illustrates the process for fabricating an acoustic resonator device similar to that shown in FIG. 1B. The method for this example of an acoustic resonator can go through similar steps as described in FIGS. 1-5. FIG. 14A shows where this method differs from that described previously. Here, the top cap structure substrate 119 and only includes one layer of metallization with one or more bottom bond pads 142. Compared to FIG. 6, there are no via structures in the top cap structure because the interconnections will be formed on the bottom side of the acoustic resonator device.

Figure 14B:
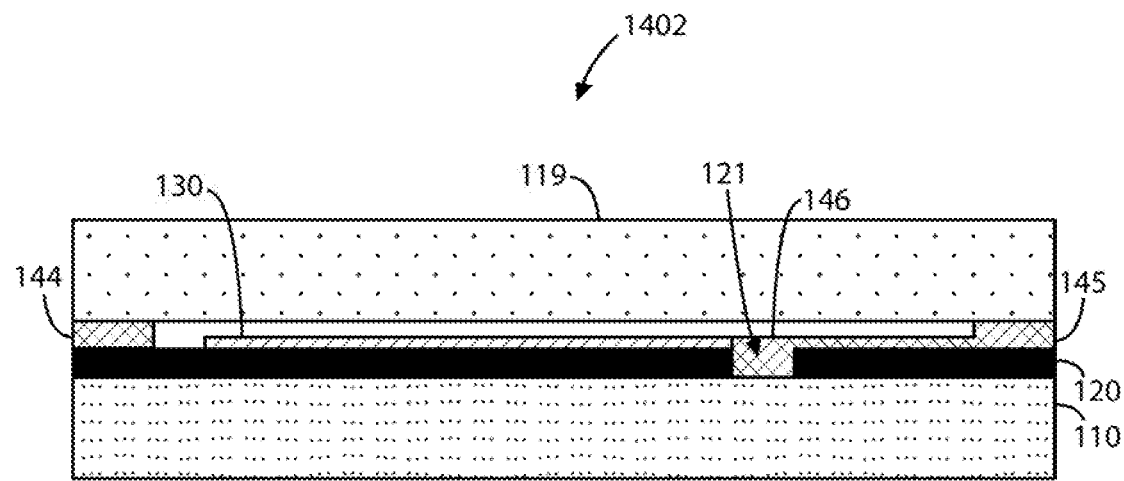
Figure 14C:
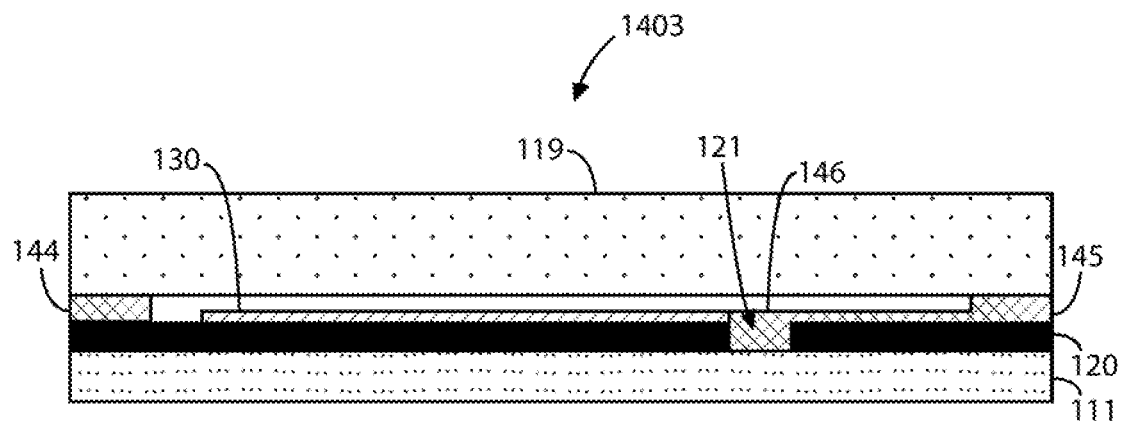
Figure 14D:
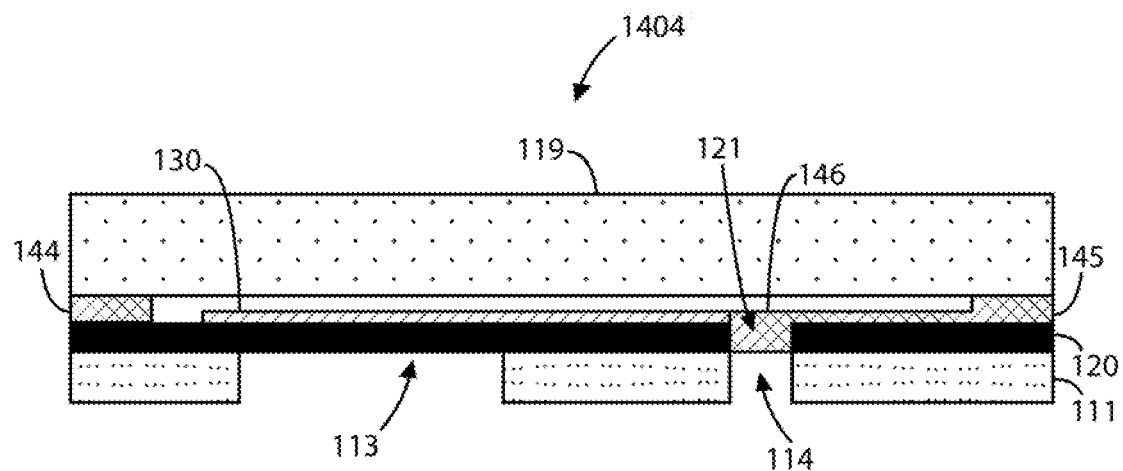
Figure 14E:
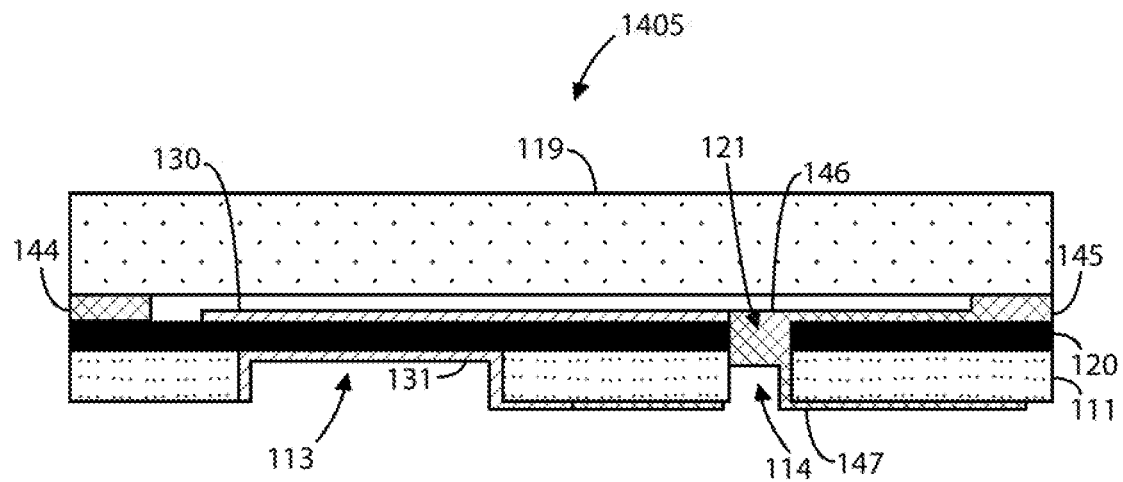
Figure 14F:
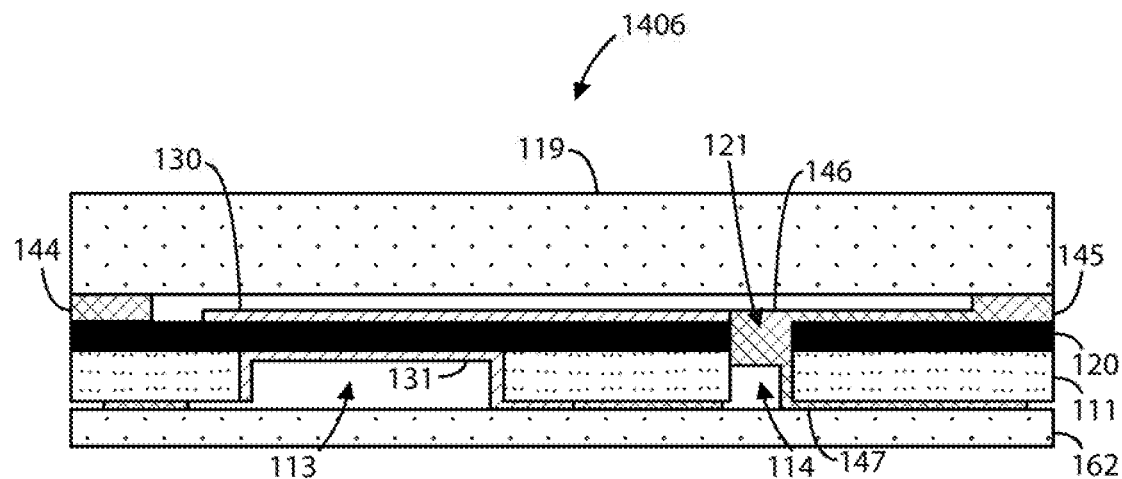

FIGS. 14B to 14F depict method steps similar to those described in the first process flow. FIG. 14B can represent a method step of bonding the top cap structure to the piezoelectric layer 120 through the bond pads (140, 142) and the topside metal 141, now denoted as bond pads 144 and topside metal 145 with topside metal plug 146. FIG. 14C can represent a method step of thinning the seed substrate 110, which forms a thinned seed substrate 111, similar to that described in FIG. 8. FIG. 14D can represent a method step of forming first and second backside trenches, similar to that described in FIG. 9A. FIG. 14E can represent a method step of forming a backside metal electrode 131 and a backside metal plug 147, similar to that described in FIG. 10. FIG. 14F can represent a method step of bonding a backside cap structure 162, similar to that described in FIGS. 11A and 11B.

Figure 14G:
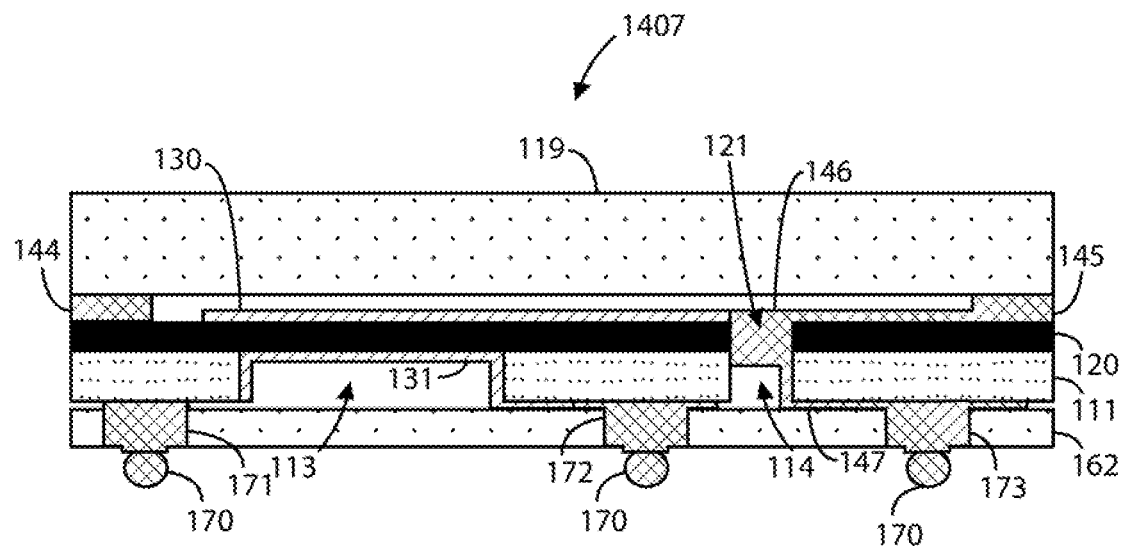

FIG. 14G shows another step that differs from the previously described process flow. Here, the backside bond pads 171, 172, and 173 are formed within the backside cap structure 162. In an example, these backside bond pads 171-173 can be formed through a masking, etching, and metal deposition processes similar to those used to form the other metal materials. A BGA process can be applied to form solder balls 170 in contact with these backside bond pads 171-173, which prepares the acoustic resonator device 1407 for wire bonding.

Figure 15A:
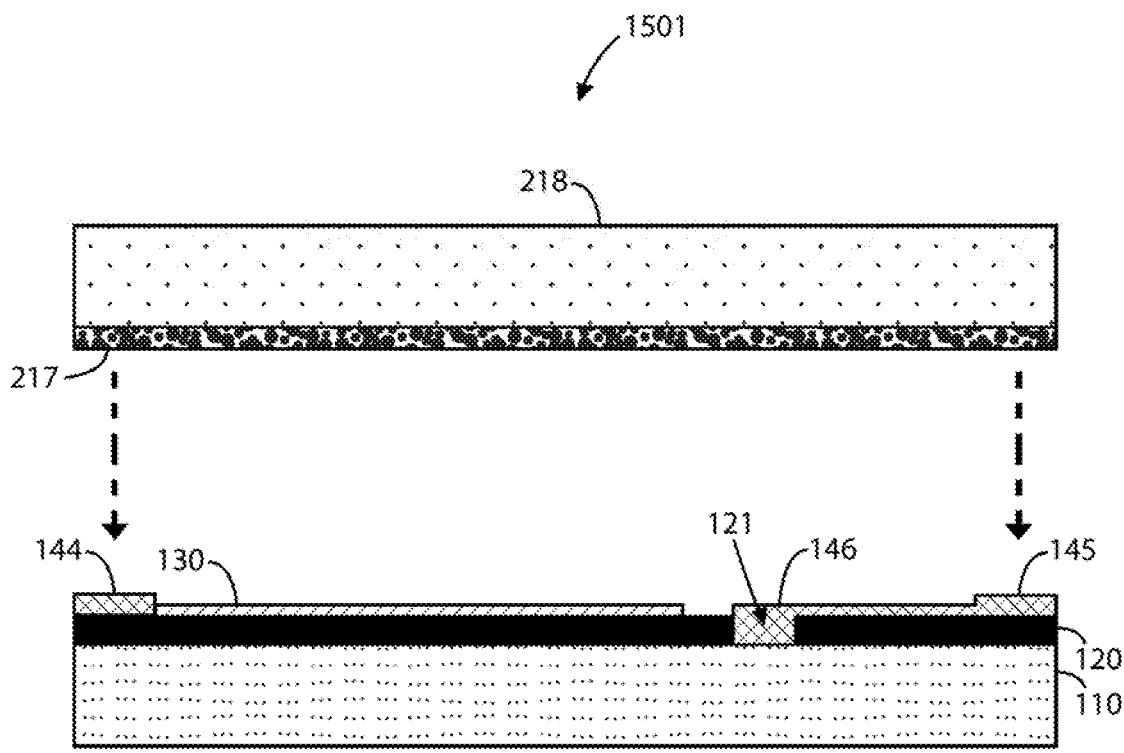
FIGS. 15A-15E are simplified diagrams illustrating method steps for making an acoustic resonator device with shared backside trench, which can be implemented in both interposer/cap and interposer free versions, according to examples of the present invention.

FIGS. 15A to 15E are simplified diagrams illustrating steps for a method of manufacture for an acoustic resonator device according to an example of the present invention. This method illustrates the process for fabricating an acoustic resonator device similar to that shown in FIG. 1B. The method for this example can go through similar steps as described in FIG. 1-5. FIG. 15A shows where this method differs from that described previously. A temporary carrier 218 with a layer of temporary adhesive 217 is attached to the substrate. In a specific example, the temporary carrier 218 can include a glass wafer, a silicon wafer, or other wafer and the like.

Figure 15B:
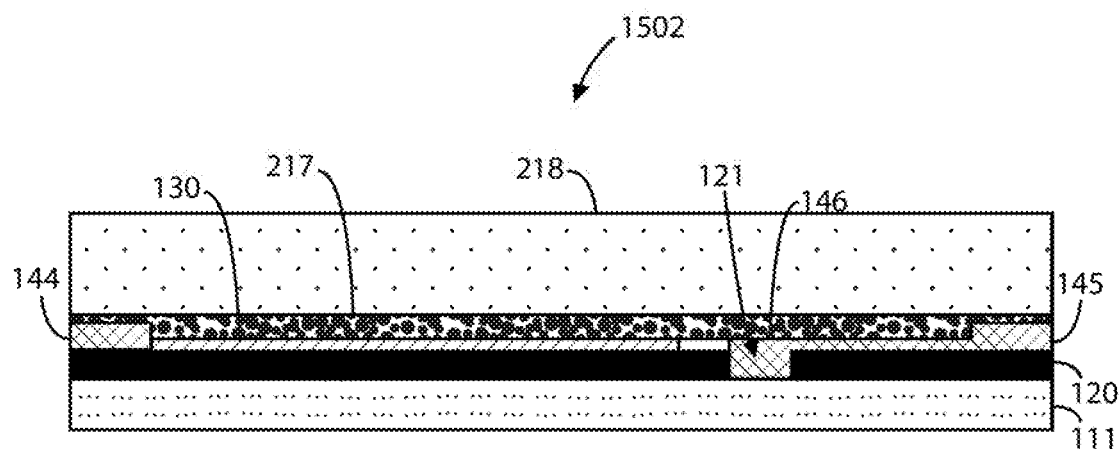

FIGS. 15B to 15F depict method steps similar to those described in the first process flow. FIG. 15B can represent a method step of thinning the seed substrate 110, which forms a thinned substrate 111, similar to that described in FIG. 8. In a specific example, the thinning of the seed substrate 110 can include a back side grinding process followed by a stress removal process. The stress removal process can include a dry etch, a Chemical Mechanical Planarization (CMP), and annealing processes.

Figure 15C:
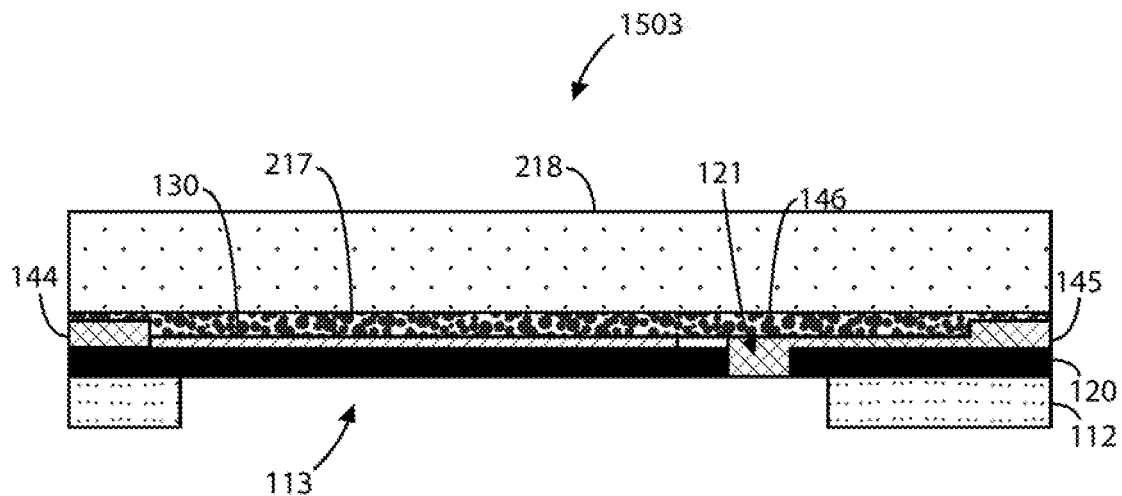

FIG. 15C can represent a method step of forming a shared backside trench 113, similar to the techniques described in FIG. 9A. The main difference is that the shared backside trench is configured underlying both topside metal electrode 130, topside micro-trench 121, and topside metal plug 146. In an example, the shared backside trench 113 is a backside resonator cavity that can vary in size, shape (all possible geometric shapes), and side wall profile (tapered convex, tapered concave, or right angle). In a specific example, the forming of the shared backside trench 113 can include a litho-etch process, which can include a back-to-front alignment and dry etch of the backside substrate 111. The piezoelectric layer 120 can serve as an etch stop layer for the forming of the shared backside trench 113.

Figure 15D:
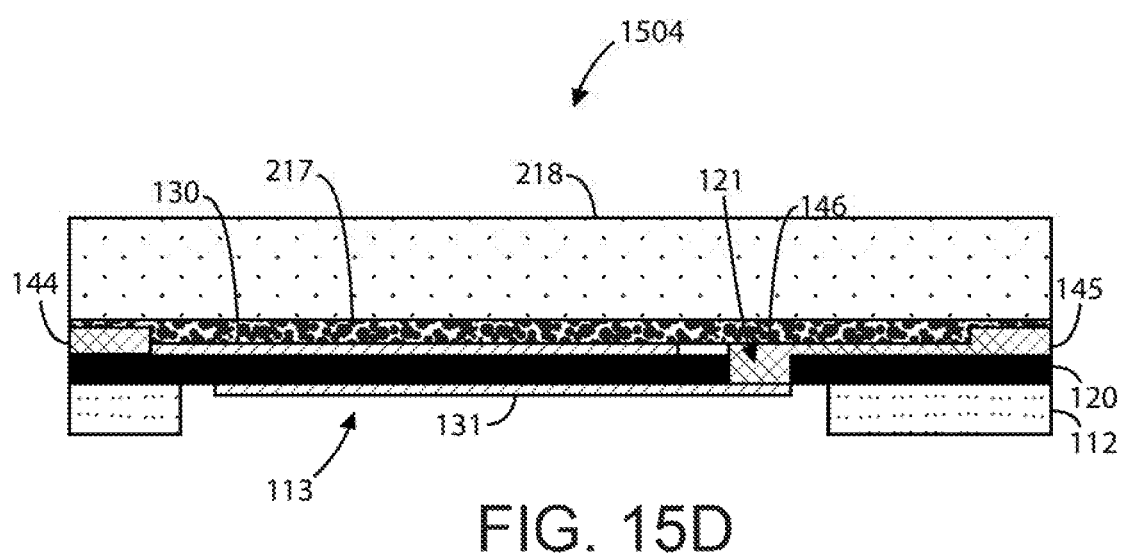

FIG. 15D can represent a method step of forming a backside metal electrode 131 and a backside metal 147, similar to that described in FIG. 10. In an example, the forming of the backside metal electrode 131 can include a deposition and patterning of metal materials within the shared backside trench 113. Here, the backside metal 131 serves as an electrode and the backside plug/connect metal 147 within the micro-via 121. The thickness, shape, and type of metal can vary as a function of the resonator/filter design. As an example, the backside electrode 131 and via plug metal 147 can be different metals. In a specific example, these backside metals 131, 147 can either be deposited and patterned on the surface of the piezoelectric layer 120 or rerouted to the backside of the substrate 112. In an example, the backside metal electrode may be patterned such that it is configured within the boundaries of the shared backside trench such that the backside metal electrode does not come in contact with one or more side-walls of the seed substrate created during the forming of the shared backside trench.

Figure 15E:
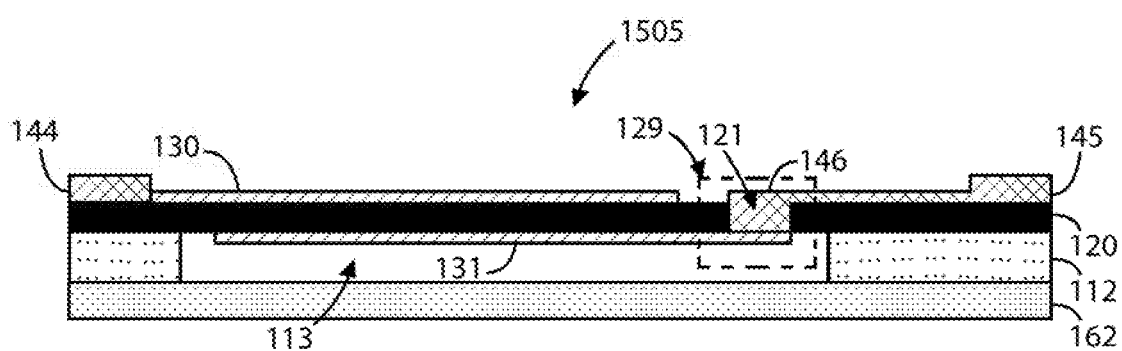

FIG. 15E can represent a method step of bonding a backside cap structure 162, similar to that described in FIGS. 11A and 11B, following a de-bonding of the temporary carrier 218 and cleaning of the topside of the device to remove the temporary adhesive 217. Those of ordinary skill in the art will recognize other variations, modifications, and alternatives of the methods steps described previously.

According to an example, the present invention includes a method for forming a piezoelectric layer to fabricate an acoustic resonator device. More specifically, the present method includes forming a single crystal material to be used to fabricate the acoustic resonator device. By modifying the strain state of the III-Nitride (III-N) crystal lattice, the present method can change the piezoelectric properties of the single crystal material to adjust the acoustic properties of subsequent devices fabricated from this material. In a specific example, the method for forming the strained single crystal material can include modification of growth conditions of individual layers by employing one or a combination of the following parameters; gas phase reactant ratios, growth pressure, growth temperature, use of surfactant species, and introduction of impurities.

In an example, the single crystal material is grown epitaxially upon a substrate. Methods for growing the single crystal material can include metal-organic chemical vapor deposition (MOCVD), molecular beam epitaxy (MBE), hydride vapor phase epitaxy (HVPE), atomic layer deposition (ALD), or the like. Various process conditions can be selectively varied to change the piezoelectric properties of the single crystal material. These process conditions can include temperature, pressure, layer thickness, gas phase ratios, and the like. For example, the temperature conditions for films containing aluminum (Al) and gallium (Ga) and their alloys can range from about 800 to about 1500 degrees Celsius. The temperature conditions for films containing Al, Ga, and indium (In) and their alloys can range from about 600 to about 1000 degrees Celsius. In another example, the pressure conditions for films containing Al, Ga, and In and their alloys can range from about 1E-4 Torr to about 900 Torr.

Figure 16:
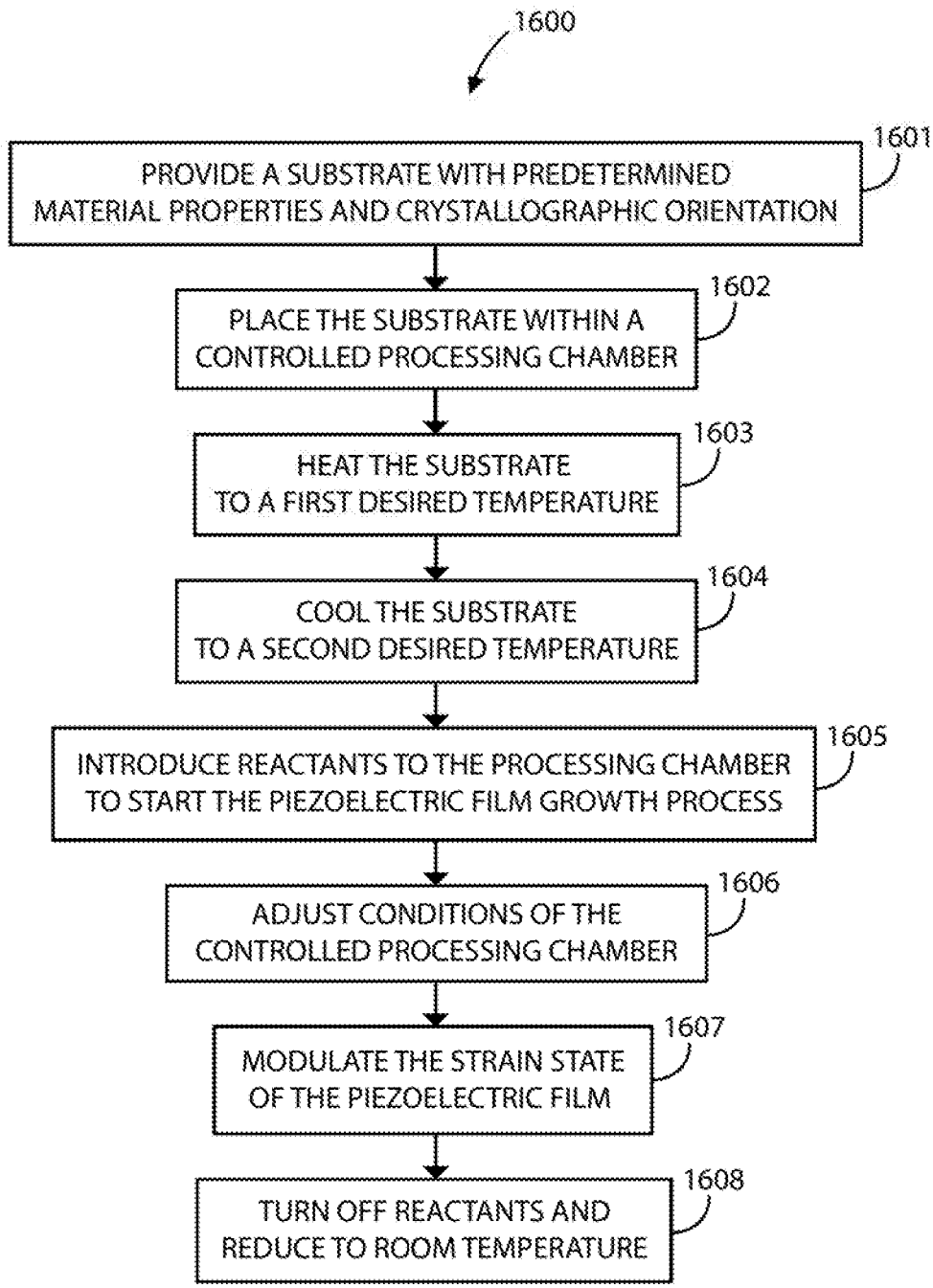
FIG. 16 is a simplified flow diagram illustrating a method for manufacturing an acoustic resonator device according to an example of the present invention.

FIG. 16 is a flow diagram illustrating a method for manufacturing an acoustic resonator device according to an example of the present invention. The following steps are merely examples and should not unduly limit the scope of the claims herein. One of ordinary skill in the art would recognize many other variations, modifications, and alternatives. For example, various steps outlined below may be added, removed, modified, rearranged, repeated, and/or overlapped, as contemplated within the scope of the invention. A typical growth process 1600 can be outlined as follows:

1601. Provide a substrate having the required material properties and crystallographic orientation. Various substrates can be used in the present method for fabricating an acoustic resonator device such as Silicon, Sapphire, Silicon Carbide, Gallium Nitride (GaN) or Aluminum Nitride (AlN) bulk substrates. The present method can also use GaN templates, AlN templates, and $Al_xGa_{1-x}N$ templates (where x varies between 0.0 and 1.0). These substrates and templates can have polar, non-polar, or semi-polar crystallographic orientations. Those of ordinary skill in the art will recognize other variations, modifications, and alternatives;

1602. Place the selected substrate into a processing chamber within a controlled environment;

1603. Heat the substrate to a first desired temperature. At a reduced pressure between 5-800 mbar the substrates are heated to a temperature in the range of 1100°-1350° C. in the presence of purified hydrogen gas as a means to clean the exposed surface of the substrate. The purified hydrogen flow shall be in the range of 5-30 slpm (standard liter per minute) and the purity of the gas should exceed 99.9995%;

1604. Cool the substrate to a second desired temperature. After 10-15 minutes at elevated temperature, the substrate surface temperature should be reduced by 100-200° C.; the temperature offset here is determined by the selection of substrate material and the initial layer to be grown (Highlighted in FIGS. 18A-C);

1605. Introduce reactants to the processing chamber. After the temperature has stabilized the Group III and Group V reactants are introduced to the processing chamber and growth is initiated.

1606. Upon completion of the nucleation layer the growth chamber pressures, temperatures, and gas phase mixtures may be further adjusted to grow the layer or plurality of layers of interest for the acoustic resonator device.

1607. During the film growth process the strain-state of the material may be modulated via the modification of growth conditions or by the controlled introduction of impurities into the film (as opposed to the modification of the electrical properties of the film).

1608. At the conclusion of the growth process the Group III reactants are turned off and the temperature resulting film or films are controllably lowered to room. The rate of thermal change is dependent upon the layer or plurality of layers grown and in the preferred embodiment is balanced such that the physical parameters of the substrate including films are suitable for subsequent processing.

Referring to step 1605, the growth of the single crystal material can be initiated on a substrate through one of several growth methods: direct growth upon a nucleation layer, growth upon a super lattice nucleation layer, and growth upon a graded transition nucleation layer. The growth of the single crystal material can be homoepitaxial, heteroepitaxial, or the like. In the homoepitaxial method, there is a minimal lattice mismatch between the substrate and the films such as the case for a native III-N single crystal substrate material. In the heteroepitaxial method, there is a variable lattice mismatch between substrate and film based on in-plane lattice parameters. As further described below, the combinations of layers in the nucleation layer can be used to engineer strain in the subsequently formed structure.

Referring to step 1606, various substrates can be used in the present method for fabricating an acoustic resonator device. Silicon substrates of various crystallographic orientations may be used. Additionally, the present method can use sapphire substrates, silicon carbide substrates, gallium nitride (GaN) bulk substrates, or aluminum nitride (AlN) bulk substrates. The present method can also use GaN templates, AlN templates, and $Al_xGa_{1-x}N$ templates (where x varies between 0.0 and 1.0). These substrates and templates can have polar, non-polar, or semi-polar crystallographic orientations. Those of ordinary skill in the art will recognize other variations, modifications, and alternatives.

In an example, the present method involves controlling material characteristics of the nucleation and piezoelectric layer(s). Such layers can be oriented in (0001) or (000-1) crystallographic directions. In a specific example, these layers can include single crystal materials that are configured with defect densities of less than 1E+11 defects per square centimeter. Also, the film thicknesses can vary between about 10 nm to about 10 um. The single crystal materials can include alloys selected from at least one of the following: AlN, AlGaN, GaN, InN, InGaN, AlInN, AlIn- GaN, AlScN, GaScN, BAlN, and BN. In various examples, any single or combination of the aforementioned materials can be used for the nucleation layer(s) and/or the piezoelectric layer(s) of the device structure.

According to an example, the present method involves strain engineering via growth parameter modification. More specifically, the method involves changing the piezoelectric properties of the epitaxial films in the piezoelectric layer via modification of the film growth conditions (these modifications can be measured and compared via the sound velocity of the piezoelectric films). These growth conditions can include nucleation conditions and piezoelectric layer conditions. The nucleation conditions can include temperature, thickness, growth rate, gas phase ratio (V/III), and the like. The piezo electric layer conditions can include transition conditions from the nucleation layer, growth temperature, layer thickness, growth rate, gas phase ratio (V/III), post growth annealing, and the like. Further details of the present method can be found below.

Figure 17:
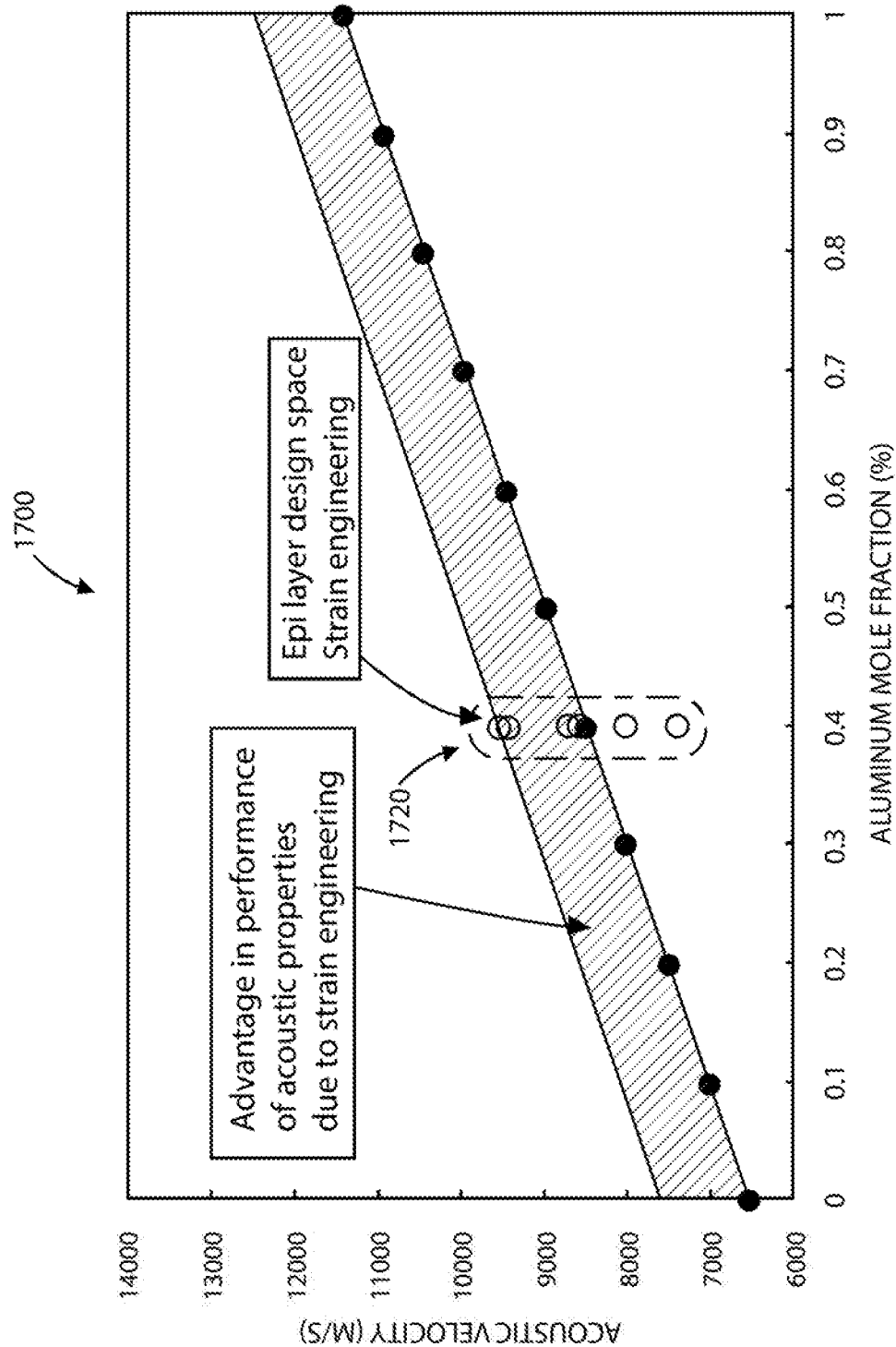
FIG. 17 is a simplified graph illustrating the results of forming a piezoelectric layer for an acoustic resonator device according to an example of the present invention. The graph highlights the ability of to tailor the acoustic properties of the material for a given Aluminum mole fraction. Such flexibility allows for the resulting resonator properties to be tailored to the individual application.

FIG. 17 is a simplified graph illustrating the results of forming a piezoelectric layer for an acoustic resonator device according to an example of the present invention. This graph highlights the ability of to tailor the acoustic properties of the material for a given Aluminum mole fraction. Referring to step 1607 above, such flexibility allows for the resulting resonator properties to be tailored to the individual application. As shown, graph 1700 depicts a plot of acoustic velocity (m/s) over aluminum mole fraction (%). The marked region 1720 shows the modulation of acoustic velocity via strain engineering of the piezo electric layer at an aluminum mole fraction of 0.4. Here, the data shows that the change in acoustic velocity ranges from about 7,500 m/s to about 9,500 m/s, which is about ±1,000 m/s around the initial acoustic velocity of 8,500 m/s. Thus, the modification of the growth parameters provides a large tunable range for acoustic velocity of the acoustic resonator device. This tunable range will be present for all aluminum mole fractions from 0 to 1.0 and is a degree of freedom not present in other conventional embodiments of this technology The present method also includes strain engineering by impurity introduction, or doping, to impact the rate at which a sound wave will propagate through the material. Referring to step 1607 above, impurities can be specifically introduced to enhance the rate at which a sound wave will propagate through the material. In an example, the impurity species can include, but is not limited to, the following: silicon (Si), magnesium (Mg), carbon (C), oxygen (O), erbium (Er), rubidium (Rb), strontium (Sr), scandium (Sc), beryllium (Be), molybdenum (Mo), zirconium (Zr), Hafnium (Hf), vanadium (Va), and yttrium (Y). Silicon, magnesium, carbon, and oxygen are common impurities used in the growth process, the concentrations of which can be varied for different piezoelectric properties. In a specific example, the impurity concentration ranges from about 1E+10 to about 1E+21 per cubic centimeter. Additionally, the impurity species may be alloyed in single crystal film between about 0.1% to about 50% atomic composition. The impurity source used to deliver the impurities to can be a source gas or liquid, which can be delivered directly, after being derived from an organometallic source, or through other like processes.

The present method also includes strain engineering by the introduction of alloying elements, to impact the rate at which a sound wave will propagate through the material. Referring to step 1607 above, alloying elements can be specifically introduced to enhance the rate at which a sound wave will propagate through the material. In an example, the alloying elements can include, but are not limited to, the following: magnesium (Mg), erbium (Er), rubidium (Rb), strontium (Sr), scandium (Sc), titanium (Ti), zirconium (Zr), Hafnium (Hf), vanadium (Va), yttrium (Y), Niobium (Nb), and tantalum (Ta). In a specific embodiment, the alloying element (ternary alloys) or elements (in the case of quaternary alloys) concentration ranges from about 0.01% to about 50%. Similar to the above, the alloy source used to deliver the alloying elements can be a source gas, which can be delivered directly, after being derived from an organometallic source, or through other like processes. Those of ordinary skill in the art will recognize other variations, modifications, and alternatives to these processes.

The methods for introducing impurities can be during film growth (in-situ) or post growth (ex-situ). During film growth, the methods for impurity introduction can include bulk doping, delta doping, co-doping, and the like. For bulk doping, a flow process can be used to create a uniform dopant incorporation. For delta doping, flow processes can be intentionally manipulated for localized areas of higher dopant incorporation. For co-doping, the any doping methods can be used to simultaneously introduce more than one dopant species during the film growth process. Following film growth, the methods for impurity introduction can include ion implantation, chemical treatment, surface modification, diffusion, co-doping, or the like. Those of ordinary skill in the art will recognize other variations, modifications, and alternatives.

Figure 18A:
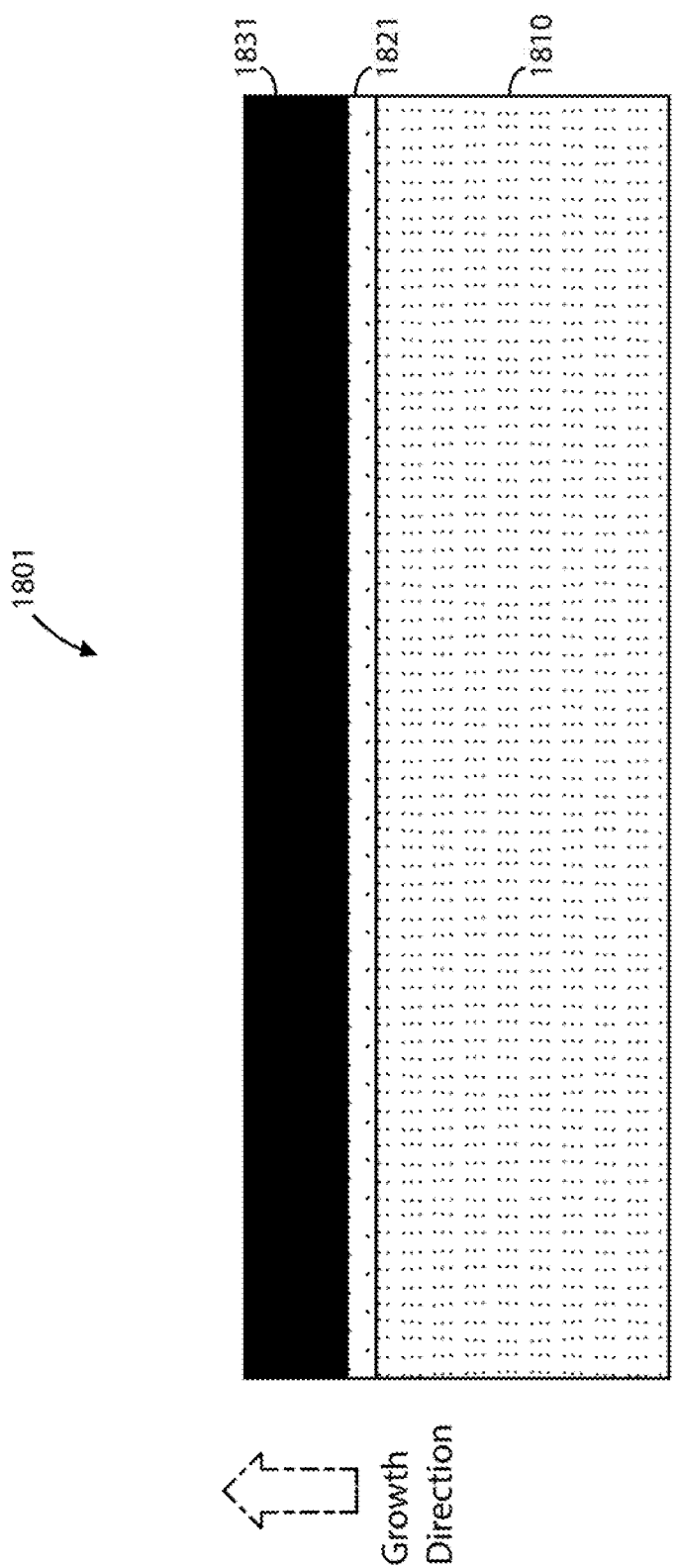
FIG. 18A is a simplified diagram illustrating a method for forming a piezoelectric layer for an acoustic resonator device according to an example of the present invention.

FIG. 18A is a simplified diagram illustrating a method for forming a piezoelectric layer for an acoustic resonator device according to an example of the present invention. As shown in device 1801, the piezoelectric layer 1831, or film, is directly grown on the nucleation layer 1821, which is formed overlying a surface region of a substrate 1810. The nucleation layer 1821 may be the same or different atomic composition as the piezoelectric layer 1831. Here, the piezoelectric film 1831 may be doped by one or more species during the growth (in-situ) or post-growth (ex-situ) as described previously.

Figure 18B:
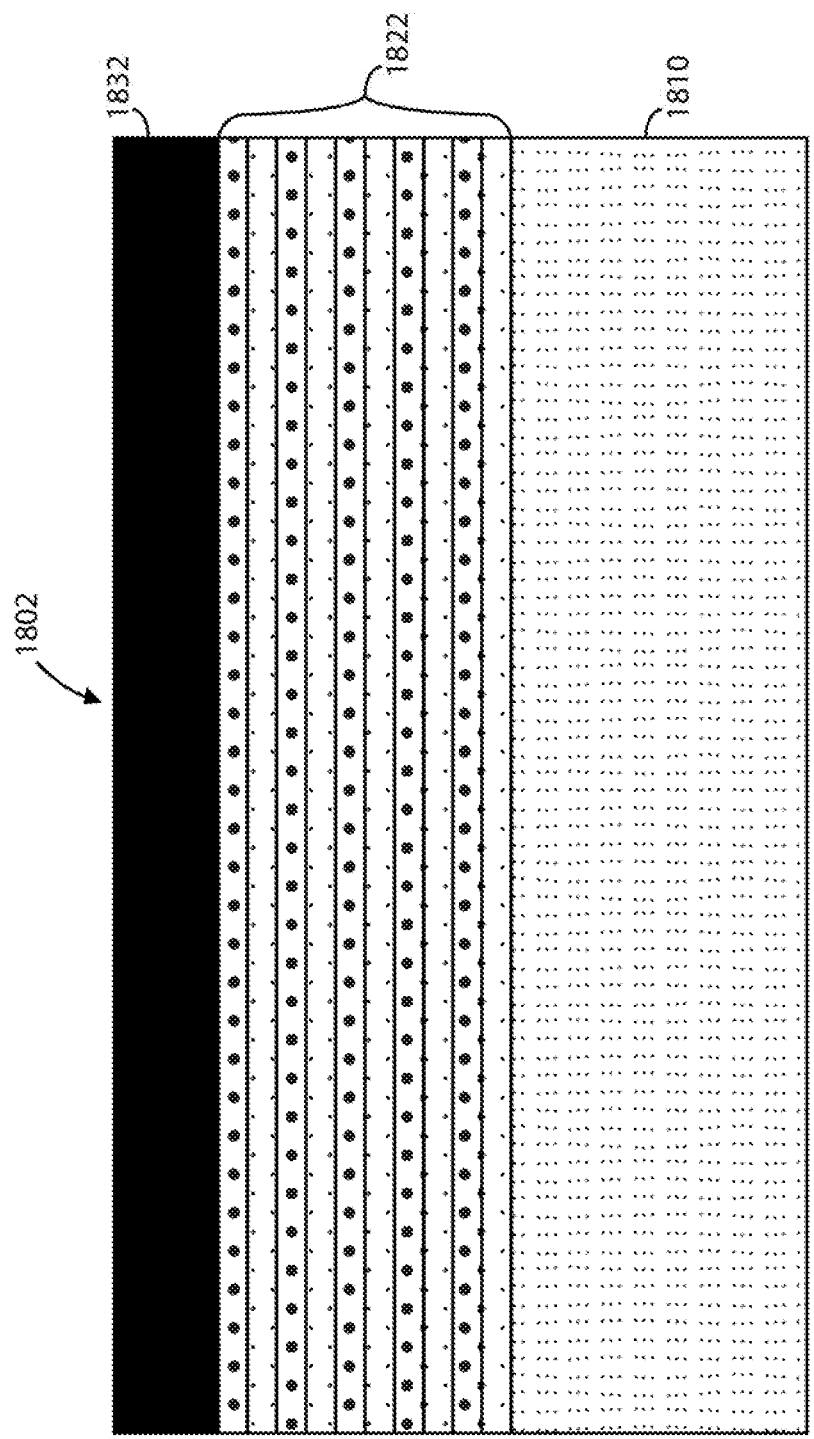
FIG. 18B is a simplified diagram illustrating a method for forming a piezoelectric layer for an acoustic resonator device according to an example of the present invention.

FIG. 18B is a simplified diagram illustrating a method for forming a piezoelectric layer for an acoustic resonator device according to an example of the present invention. As shown in device 1802, the piezoelectric layer 1832, or film, is grown on a super lattice nucleation layer 1822, which is comprised of layer with alternating composition and thickness. This super lattice layer 1822 is formed overlying a surface region of the substrate 1810. The strain of device 1802 can be tailored by the number of periods, or alternating pairs, in the super lattice layer 1822 or by changing the atomic composition of the constituent layers. Similarly, the piezoelectric film 1832 may be doped by one or more species during the growth (in-situ) or post-growth (ex-situ) as described previously.

Figure 18C:
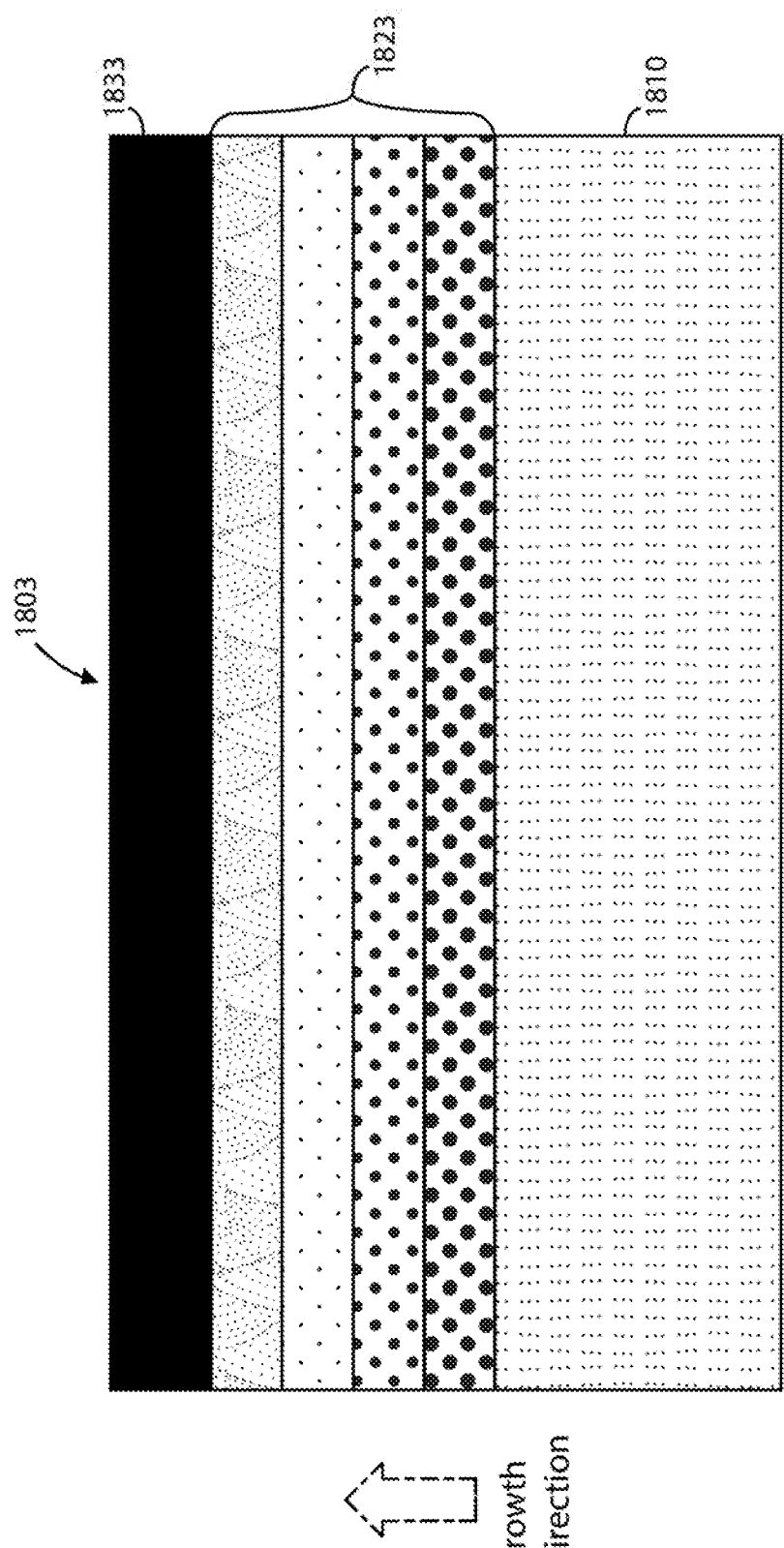
FIG. 18C is a simplified diagram illustrating a method for forming a piezoelectric layer for an acoustic resonator device according to an example of the present invention.

FIG. 18C is a simplified diagram illustrating a method for forming a piezoelectric layer for an acoustic resonator device according to an example of the present invention. As shown in device 1803, the piezoelectric layer 1833, or film, is grown on graded transition layers 1823. These transition layers 1823, which are formed overlying a surface region of the substrate 1810, can be used to tailor the strain of device 1803. In an example, the alloy (binary or ternary) content can be decreased as a function of growth in the growth direction. This function may be linear, step-wise, or continuous. Similarly, the piezoelectric film 1833 may be doped by one or more species during the growth (in-situ) or post-growth (ex-situ) as described previously.

In an example, the present invention provides a method for manufacturing an acoustic resonator device. As described previously, the method can include a piezoelectric film growth process such as a direct growth upon a nucleation layer, growth upon a super lattice nucleation layer, or a growth upon graded transition nucleation layers. Each process can use nucleation layers that include, but are not limited to, materials or alloys having at least one of the following: AlN, AlGaN, GaN, InN, InGaN, AlInN, AlInGaN, AlScN, GaScN, BAlN, and BN. Those of ordinary skill in the art will recognize other variations, modifications, and alternatives.

In an example, the present invention provides a method and structure for a full (hybrid) stack acoustic resonator device that includes at least a single crystal film and a poly crystal film. The poly crystal film can be thermally treated to drive crystallization of the polycrystalline thin film to improve the crystalline quality and enhance piezoelectric properties. The hybrid approach allows for the enhancement of device materials and performance beyond devices using typical textured polycrystalline methods or techniques.

Figure 19A:
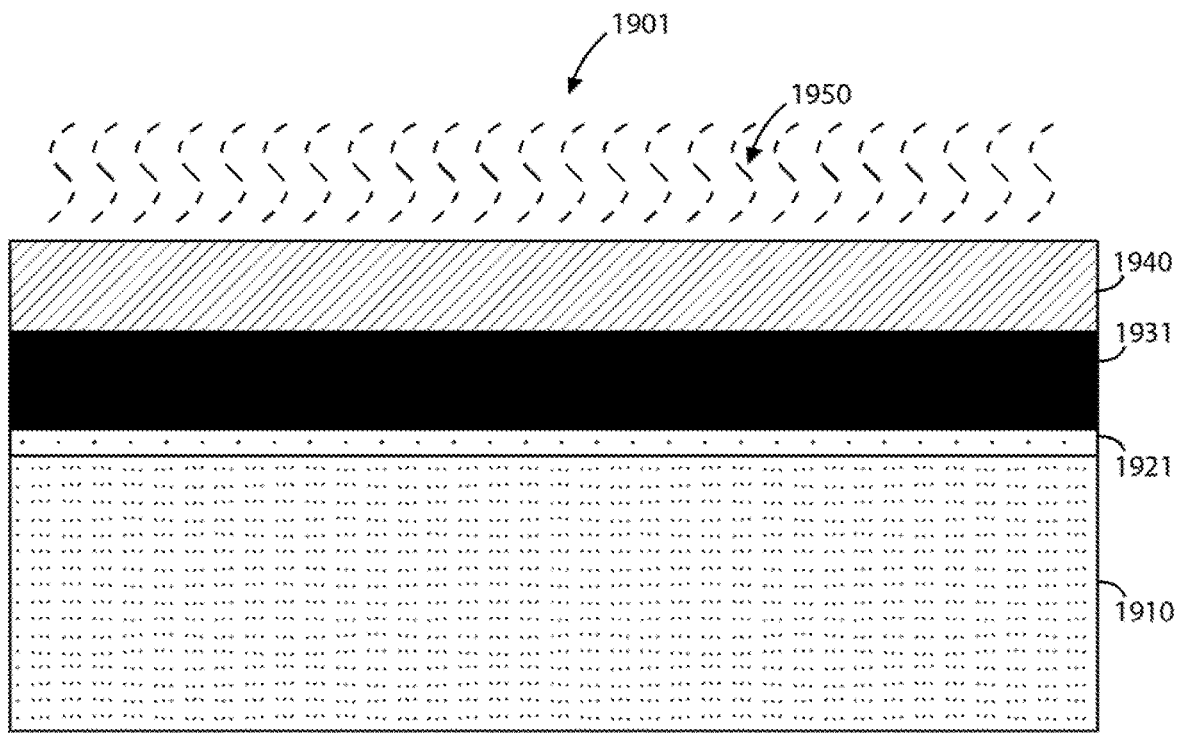
FIG. 19A is a simplified diagram illustrating a method for forming a thermally recrystallized piezoelectric layer for an acoustic resonator device according to an example of the present invention.

FIG. 19A is a simplified diagram illustrating a method for forming a thermally recrystallized piezoelectric layer for an acoustic resonator device according to an example of the present invention. As shown, the device 1901 includes a single crystal piezoelectric layer 1931, or film, directly grown on the nucleation layer 1921, which is formed overlying a surface region of a substrate 1910. The nucleation layer 1921 may be the same or different atomic composition as the piezoelectric layer 1931. Similar to the embodiments shown in FIGS. 18A-18C, the piezoelectric layer 1931 may be doped by one or more species during the growth (in-situ) or post-growth (ex-situ) as described previously.

Figure 19B:
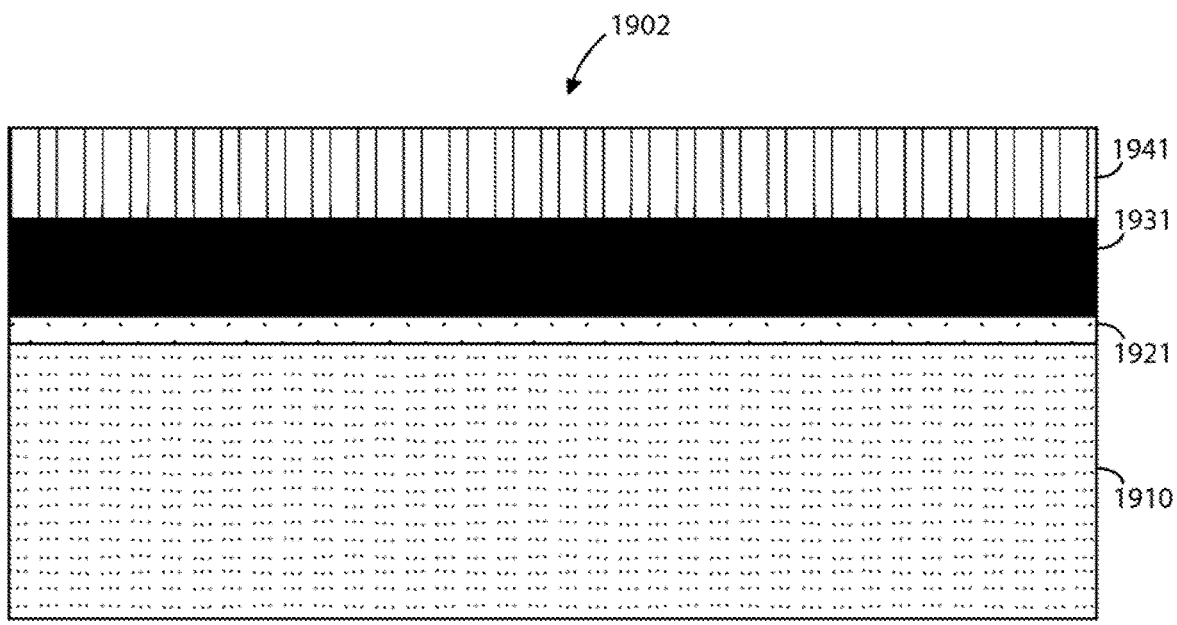
FIG. 19B is a simplified diagram illustrating an acoustic resonator device having a thermally recrystallized piezoelectric layer according to an example of the present invention.

Additionally, a polycrystalline (or poly crystal) piezoelectric layer 1940 is formed overlying the single crystal piezoelectric layer. The single crystal piezoelectric layer 1931 can serve as the seed substrate for the poly crystal layer 1940. The device 1901 is subject to a thermal treatment 1950, which can be characterized by a temperature of greater than 1000 degrees Celsius with a nitrogen/ammonia overpressure environment. This thermal treatment recrystallizes the polycrystalline layer 1940 to produce a resulting film 1941 (resulting device 1902 shown in FIG. 19B), that is more crystallographically oriented with enhanced piezoelectric properties than typical polycrystalline films. In a specific example, the resulting thermally-treated poly crystal layer 1941 is an essentially single crystal material. After thermal treatment, the recrystallized poly crystal layer 1941 can include a plurality of reordered polycrystalline films that collectively exhibit characteristics of a single crystal layer. The application of recrystallized polycrystalline piezoelectric layers can be applied in combination with the previously described methods for modifying the single crystal layers.

In an example, the polycrystalline layer/film 1940 can be deposited upon the single crystal film 1931, which serves as a single crystal seed/substrate. The film 1940 can be oriented in the (0001) or (000-1) crystallographic direction. The film thickness can be between about 10 nm and about 10 um. The materials included within this film can be selected from at least one of the following: AlN, AlGaN, GaN, InN, InGaN, AlInN, AlInGaN, AlScN, GaScN, BAlN, BN, AlYN, BAlScN. Further, the polycrystalline film 1940 may be doped or un-doped, which may be accomplished during the growth of the polycrystalline material (in-situ) or afterward (ex-situ), and one or more impurity/dopant may be added to the film during this process.

The polycrystalline film 1940 can be deposited via sputtering or other like method. In a specific example, impurities can be introduced into the polycrystalline film 1940 during the growth (in-situ) or post-growth (ex-situ), similar to the single crystal film growth methods. For in-situ scenarios, the method of impurity introduction can include bulk doping, delta doping, co-doping, and the like. Bulk doping involves a flow for the entire layer, which results in uniform incorporation. Delta doping involves intentionally manipulating flows for localized areas of higher dopant incorporation. Co-doping involves the simultaneous introduction of more than one dopant species. For ex-situ scenarios, the method of impurity introduction can include ion implantation, chemical treatment, surface modification, diffusion (chemically and thermally assisted), co-doping (as described previously), and the like. Those of ordinary skill in the art will recognize other variations, modifications, and alternatives.

One or more benefits are achieved over pre-existing techniques using the invention. In particular, the present device can be manufactured in a relatively simple and cost effective manner while using conventional materials and/or methods according to one of ordinary skill in the art. Using the present method, one can create a reliable single crystal based acoustic resonator using multiple ways of three-dimensional stacking through a wafer level process or an acoustic resonator with a hybrid thermally recrystallized polycrystalline and single crystalline piezo stack. An acoustic resonator implementing the present hybrid piezoelectric stack can exhibit improved electromechanical coupling (k2) and enable wide bandwidth filter performance. Such filters or resonators can be implemented in an RF filter device, an RF filter system, or the like. Depending upon the embodiment, one or more of these benefits may be achieved. Of course, there can be other variations, modifications, and alternatives.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as an aluminum, gallium, or ternary compound of aluminum and gallium and nitrogen containing epitaxial region, or functional regions, combinations, and the like. Therefore, the above description and illustrations should not be taken as limiting the scope of the present invention which is defined by the appended claims.

What is claimed is:

1. A method for fabricating an acoustic material stack, the method comprising:
   providing a substrate having a substrate surface region;
   forming a nucleation layer overlying the substrate surface region;
   forming a strained single crystal piezoelectric layer overlying the nucleation layer and having a strain condition, wherein forming the strained single crystal piezoelectric layer includes an epitaxial growth process on the nucleation layer to modulate the strain condition in the strained single crystal piezoelectric layer to improve one or more piezoelectric properties of the strained single crystal piezoelectric layer;
   depositing a polycrystalline piezoelectric layer overlying the strained single crystal piezoelectric layer; and
   performing a thermal treatment on the polycrystalline piezoelectric layer overlying the strained single crystal piezoelectric layer; thereby recrystallizing the polycrystalline piezoelectric layer to exhibit characteristics of a single crystal piezoelectric layer in order to form a hybrid thermally recrystallized polycrystalline and single crystalline piezo stack.

2. The method of claim 1 wherein the substrate is selected from one of the following: a silicon substrate, a silicon-on-insulator (SOI) substrate, a sapphire substrate, a silicon carbide substrate, a GaN bulk substrate, a GaN template, an AlN bulk, an AlN template, and an $Al_xGa_{1-x}N$ template.

3. The method of claim 1 wherein at least one of the nucleation layer, the strained single crystal piezoelectric layer, and the polycrystalline piezoelectric layer includes materials or alloys having at least one of the following: AlN, AlGaN, GaN, InN, InGaN, AlInN, AlInGaN, AlScN, GaScN, BAlN, BN, AlYN, BAlScN, and AlYScN.

4. The method of claim 1 wherein
the epitaxial growth process is selected from one of the following: metal-organic chemical vapor deposition (MOCVD), molecular beam epitaxy (MBE), hydride vapor phase epitaxy (HVPE), and atomic layer deposition (ALD).

5. The method of claim 4 wherein the nucleation layer is characterized by nucleation growth parameters including temperature, pressure, thickness, growth rate, gas phase ratio of reactant species, use of surfactant species, and impurity concentration; and
wherein the epitaxial growth process is configured by the nucleation growth parameters to modulate the strain condition in the strained single crystal piezoelectric layer to improve one or more piezoelectric properties of the strained single crystal piezoelectric layer, the one or more piezoelectric properties including acoustic velocity.

6. The method of claim 4 wherein the strained single crystal piezoelectric layer is characterized by piezoelectric parameters including thickness and temperature; and
wherein the epitaxial growth process is configured by the piezoelectric layer parameters to modulate the strain condition in the strained single crystal piezoelectric layer to improve one or more piezoelectric properties of the strained single crystal piezoelectric layer, the one or more piezoelectric properties including acoustic velocity.

7. The method of claim 1 wherein at least one of the strained single crystal piezoelectric layer and the polycrystalline piezoelectric layer is oriented in the (0001) or (000-1) crystallographic direction.

8. The method of claim 1 further comprising doping at least one of the strained single crystal piezoelectric layer and the polycrystalline piezoelectric layer, wherein the doping includes the introduction of one or more impurity species during growth (in-situ) and includes bulk doping, delta doping, or co-doping processes, wherein the one or more impurity species includes at least one of the following: silicon (Si), magnesium (Mg), carbon (C), oxygen (O), erbium (Er), rubidium (Rb), strontium (Sr), scandium (Sc), beryllium (Be), molybdenum (Mo), zirconium (Zr), Hafnium (Hf), vanadium (Va), and yttrium (Y); wherein the one or more impurity species has impurity concentration ranging from 1E+10 to 1E+21 per cubic centimeter and ranging between 0.1% to 50% atomic composition.

9. The method of claim 1 further comprising doping at least one of the strained single crystal piezoelectric layer or the polycrystalline piezoelectric layer, wherein the doping includes the introduction of one or more impurity species post growth (ex-situ) and includes ion implantation, chemical treatment, surface modification, diffusion, or co-doping processes, wherein the one or more impurity species includes at least one of the following: silicon (Si), magnesium (Mg), carbon (C), oxygen (O), erbium (Er), rubidium (Rb), strontium (Sr), scandium (Sc), beryllium (Be), molybdenum (Mo), zirconium (Zr), Hafnium (Hf), vanadium (Va), and yttrium (Y); wherein the one or more impurity species has impurity concentration ranging from 1E+10 to 1E+21 per cubic centimeter and ranging between 0.1% to 50% atomic concentration.

10. The method of claim 1 wherein the strained single crystal piezoelectric material has a thickness from 10 nm to 10 um, is characterized by a defect density less than $10^{12}$ defects/cm$^2$, and has an x-ray rocking curve full width at half maximum (FWHM) less than or equal to 1 degree; and
wherein the polycrystalline piezoelectric layer is characterized by a thickness of 10 nm to 10 um.

11. The method of claim 1 wherein performing the thermal treatment includes heating the polycrystalline piezoelectric layer at a temperature greater than 1000 degrees Celsius.

12. The method of claim 1 wherein performing the thermal treatment includes heating the polycrystalline piezoelectric layer with nitrogen/ammonia overpressure.

13. The method of claim 1 wherein forming the polycrystalline piezoelectric layer includes using the strained single crystal piezoelectric layer as a seed substrate.

14. The method of claim 1 further comprising forming an acoustic resonator device from the hybrid thermally recrystallized polycrystalline and single crystalline piezo stack.

15. The method of claim 14 wherein forming the acoustic resonator device includes forming a bulk acoustic wave resonator device configured within a filter device.

16. A method for fabricating an acoustic material stack, the method comprising:
providing a substrate having a substrate surface region;
forming a nucleation layer overlying the substrate surface region and being characterized by nucleation growth parameters;
forming a strained single crystal piezoelectric layer overlying the nucleation layer and having a strain condition and piezoelectric layer parameters, wherein forming the strained single crystal piezoelectric layer includes an epitaxial growth process configured by nucleation growth parameters and piezoelectric layer parameters to modulate the strain condition in the strained single crystal piezoelectric layer to improve one or more piezoelectric properties of the strained single crystal piezoelectric layer;
depositing a polycrystalline piezoelectric layer overlying the strained single crystal piezoelectric layer; and
performing a thermal treatment on the polycrystalline piezoelectric layer overlying the strained single crystal piezoelectric layer; thereby recrystallizing the polycrystalline piezoelectric layer to exhibit characteristics of a single crystal piezoelectric layer in order to form a hybrid thermally recrystallized polycrystalline and single crystalline piezo stack.

17. The method of claim 16 wherein the substrate is selected from one of the following: a silicon substrate, a silicon-on-insulator (SOI) substrate, a sapphire substrate, a silicon carbide substrate, a GaN bulk substrate, a GaN template, an AlN bulk, an AlN template, and an $Al_xGa_{1-x}N$ template.

18. The method of claim 16 wherein at least one of the nucleation layer, the strained single crystal piezoelectric layer, and the polycrystalline piezoelectric layer includes materials or alloys having at least one of the following: AlN, AlGaN, GaN, InN, InGaN, AlInN, AlInGaN, AlScN, GaScN, BAlN, BN, AlYN, BAlScN, and AlYScN.

19. The method of claim 16 wherein forming the polycrystalline piezoelectric layer includes using the strained single crystal piezoelectric layer as a seed substrate; and
wherein performing the thermal treatment includes heating the polycrystalline piezoelectric layer at a temperature greater than 1000 degrees Celsius with nitrogen/ammonia overpressure.

20. A method for fabricating an acoustic material stack, the method comprising:
providing a substrate having a substrate surface region;
forming a nucleation layer overlying the substrate surface region and being characterized by nucleation growth parameters;
forming a strained single crystal piezoelectric layer overlying the nucleation layer and having a strain condition and piezoelectric layer parameters, wherein forming the strained single crystal piezoelectric layer includes an epitaxial growth process configured by nucleation growth parameters and piezoelectric layer parameters to modulate the strain condition in the strained single crystal piezoelectric layer to improve one or more piezoelectric properties of the strained single crystal piezoelectric layer; wherein the strained single crystal piezoelectric material has a thickness from 10 nm to 10 um and is characterized by a defect density less than $10^{12}$ defects/cm$^2$, and an x-ray rocking curve full width at half maximum (FWHM) less than or equal to 1 degree;
depositing a polycrystalline piezoelectric layer overlying the strained single crystal piezoelectric layer, wherein the polycrystalline piezoelectric layer is characterized by a thickness of 10 nm to 10 um; and
performing a thermal treatment on the polycrystalline piezoelectric layer overlying the strained single crystal piezoelectric layer; thereby recrystallizing the polycrystalline piezoelectric layer to exhibit characteristics of a single crystal piezoelectric layer in order to form a hybrid thermally recrystallized polycrystalline and single crystalline piezo stack.

* * * * *